United States Patent
Shin et al.

(10) Patent No.: US 10,798,831 B2
(45) Date of Patent: Oct. 6, 2020

(54) DISPLAY DEVICE

(71) Applicant: LG Display Co., Ltd., Seoul (KR)

(72) Inventors: Mi-Na Shin, Paju-si (KR); ChounSung Kang, Gimpo-si (KR); GeunChang Park, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/560,066

(22) Filed: Sep. 4, 2019

(65) Prior Publication Data

US 2020/0084897 A1    Mar. 12, 2020

(30) Foreign Application Priority Data

Sep. 12, 2018  (KR) .................. 10-2018-0108917

(51) Int. Cl.
| | |
|---|---|
| *H05K 5/00* | (2006.01) |
| *H05K 5/03* | (2006.01) |
| *H05K 1/14* | (2006.01) |
| *H05K 5/02* | (2006.01) |

(52) U.S. Cl.
CPC .......... *H05K 5/0017* (2013.01); *H05K 1/147* (2013.01); *H05K 5/0217* (2013.01); *H05K 5/03* (2013.01); *H05K 2201/10128* (2013.01)

(58) Field of Classification Search
CPC ........ H05K 5/0017; H05K 5/03; H05K 1/147; H05K 5/0217; H05K 2201/10128; G09F 9/301
See application file for complete search history.

(56) References Cited

U.S. PATENT DOCUMENTS

| | | | |
|---|---|---|---|
| 10,164,208 B2 | 12/2018 | Lee et al. | |
| 10,345,856 B2 | 7/2019 | Song | |
| 2015/0049428 A1* | 2/2015 | Lee | G06F 1/1652 |
| | | | 361/679.27 |
| 2016/0357052 A1* | 12/2016 | Kim | H01L 51/0097 |
| 2017/0194580 A1* | 7/2017 | Lee | H01L 51/5256 |
| 2017/0294495 A1* | 10/2017 | Shyu | H01L 27/3276 |
| 2018/0070467 A1* | 3/2018 | Kim | H01L 51/5237 |
| 2018/0097197 A1* | 4/2018 | Han | G06F 1/1626 |
| 2018/0190936 A1* | 7/2018 | Lee | B32B 7/12 |
| 2019/0098774 A1* | 3/2019 | Park | H05K 5/0217 |
| 2019/0132987 A1* | 5/2019 | Koo | H04M 1/0214 |

FOREIGN PATENT DOCUMENTS

| | | |
|---|---|---|
| KR | 10-2018-0062272 A | 6/2018 |
| KR | 10-2018-0079091 A | 7/2018 |

* cited by examiner

*Primary Examiner* — Abhishek M Rathod
(74) *Attorney, Agent, or Firm* — Morgan, Lewis & Bockius LLP

(57) ABSTRACT

A display device comprises a display panel and a back cover attached to the display panel. The back cover includes a first flexible area and a first supporting area adjacent to the first flexible area. The back cover includes a central area and an edge area at one or more lateral sides of the central area. The central area includes a plurality of first openings, and the edge area includes a plurality of second openings. The first flexible area includes a first sub-flexible area and a second sub-flexible area, the first sub-flexible area being between the first supporting area and the second sub-flexible area in a column direction. A distance between two adjacent second openings in the edge area of the first sub-flexible area is smaller than a distance between two adjacent second openings in the edge area of the second sub-flexible area.

21 Claims, 28 Drawing Sheets

DISPLAY DEVICE

CROSS-REFERENCE TO RELATED APPLICATION(S)

This application claims the benefit and priority of Korean Patent Application No. 10-2018-0108917 filed on Sep. 12, 2018, in the Korean Intellectual Property Office, the disclosure of which is incorporated herein by reference as if fully set forth herein.

BACKGROUND

1. Technical Field

The present disclosure relates to a display device, and more particularly, to a rollable display device capable of displaying images even in a rolled state.

2. Description of the Related Art

Display devices used for a computer monitor, a TV, a mobile phone, and other applications include, among others, an organic light-emitting display (OLED) that emits light by itself and a liquid-crystal display (LCD) that requires a separate light source.

As display devices are applied to increasingly diverse fields, such as a computer monitor, a TV, and a personal mobile device, display devices having a large display area and a reduced volume and weight have been studied.

Recently, a rollable display device in which a display part and wiring lines are formed on a flexible substrate made of flexible plastic and which can display an image even in a rolled state has attracted attention as a next-generation display device.

SUMMARY

An object of the present disclosure is to provide a display device which can suppress a potential tear or deformation of a back cover that may otherwise be caused by the shape of a roller during winding of a display panel and the back cover.

Another object of the present disclosure is to provide a display device in which a distance between openings is different for different areas in a back cover to minimize or suppress potential damages to the back cover during winding and unwinding of the display device.

Yet another object of the present disclosure is to provide a display device in which an edge area of a back cover where a display panel is disposed has an improved rigidity, as well as having openings that are less noticeable to a user.

Still another object of the present disclosure is to provide a display device which can minimize or suppress the occurrence of scratches on a display panel that may be caused by a back cover during winding of the display panel and the back cover.

Still another object of the present disclosure is to provide a display device which can minimize or reduce the potential risk of injury to the user due to a sharp edge of a back cover.

Still another object of the present disclosure is to provide a display device which can suppress openings of a back cover from diminishing viewing characteristics of a display panel.

Objects of the present disclosure are not limited to the examples noted above, and other objects may be apparent to or understood by those skilled in the art from the present disclosure, including the detailed description and drawings.

To achieve these and other advantages and in accordance with the purpose of the present disclosure, as embodied and broadly described, a display device includes: a display panel configured to display an image; and a back cover attached to a surface of the display panel, and including a first flexible area overlapping the display panel, and a first supporting area adjacent to the first flexible area. The back cover has a central area and an edge area at one or more lateral sides of the central area, the central area and the edge area being in at least the first flexible area of the back cover. The central area includes a plurality of first openings, and the edge area includes a plurality of second openings. The first flexible area includes a first sub-flexible area and a second sub-flexible area, the first sub-flexible area being between the first supporting area and the second sub-flexible area in a column direction, the edge area being in at least the first and second sub-flexible areas of the first flexible area. Among the second openings, a distance between two adjacent second openings in the edge area of the first sub-flexible area is smaller than a distance between two adjacent second openings in the edge area of the second sub-flexible area.

According to another aspect of the present disclosure, display device includes: a display panel including a plurality of sub-pixels; a back cover supporting the display panel, and including a first supporting area and a first flexible area adjacent to the first supporting area, the first flexible area having a plurality of openings; and a roller configured to wind or unwind the display panel and the back cover, and having a flat surface and a curved surface. With the back cover in a wound state, the first supporting area is configured to be placed on the flat surface of the roller, and the first flexible area is configured to be placed on the curved surface of the roller. Among the openings in the first flexible area, a distance between two adjacent openings at a lateral edge of the back cover is greater farther away from the first supporting area than closer to the first supporting area.

Other details of example embodiments are included in the detailed description and the drawings.

According to the present disclosure, a distance between adjacent openings in a back cover may be set based on the location of a display panel in the back cover and the shape of a corresponding roller. Thus, it is possible to minimize or suppress damage to or deformation of the back cover.

According to the present disclosure, the openings may be formed in the back cover at different distances from one another for openings in a part of the back cover visible to a user and for those in another part of the back cover invisible to the user, and in a fully wound state and a fully unwound state of a display device. Thus, it is possible to improve the rigidity of an edge area of the back cover and the exterior characteristics.

According to the present disclosure, a protective resin may be placed on a rear surface of the back cover. Thus, it is possible to minimize or suppress potential damages to the display panel that may otherwise be caused by the back cover when the display panel is wound.

According to the present disclosure, the protective resin may be placed within the openings of the back cover. Thus, it is possible to suppress or prevent a plurality of openings in front of the display device from being noticeable to the user.

According to the present disclosure, the protective resin may have a larger area than the back cover. Thus, it is possible to remove or suppress sharp edges of the back cover.

The potential benefits and advantages according to the present disclosure are not limited to the examples listed above, and various additional benefits and advantages may be discussed in or apparent from the present disclosure.

It is to be understood that both the foregoing general description and the following detailed description of the present disclosure are exemplary and explanatory, and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1A:
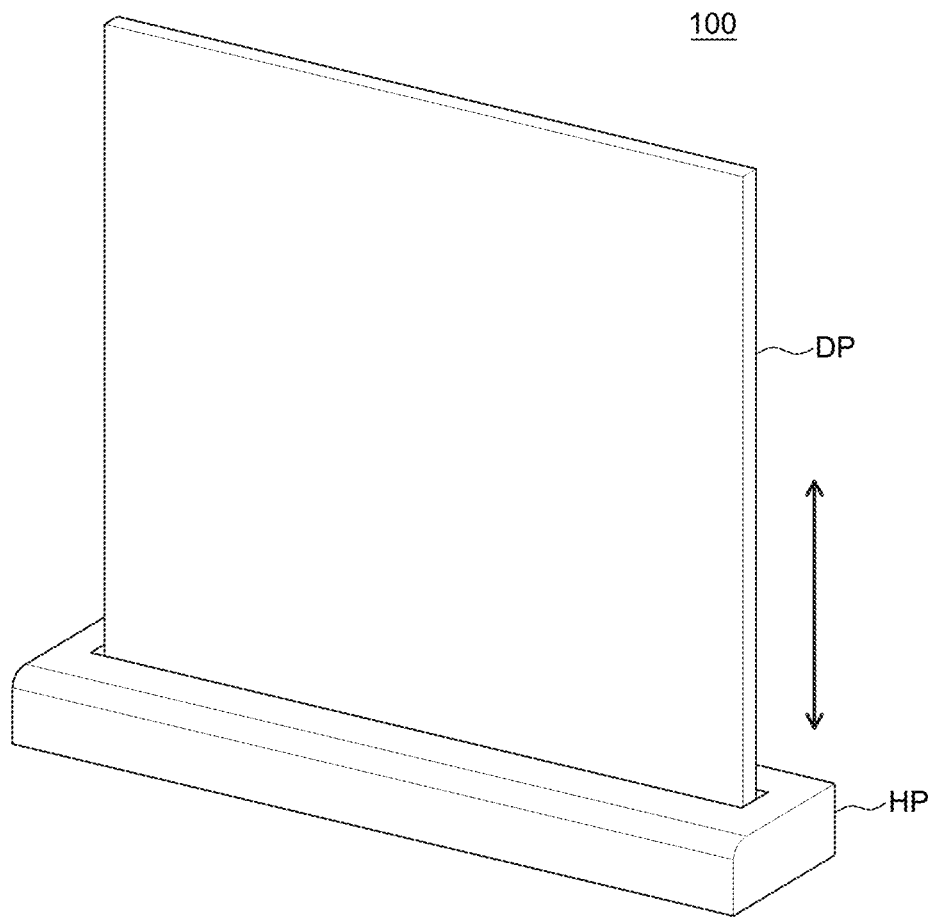
FIG. 1A and FIG. 1B are perspective views of a display device according to an example embodiment of the present disclosure.

Reference will now be made in detail to embodiments of the present disclosure, examples of which are illustrated in the accompanying drawings.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

A shape, a size, a ratio, an angle, and a number disclosed in the drawings for describing embodiments of the present disclosure are merely an example. Thus, the present disclosure is not limited to the illustrated details. Unless otherwise described, like reference numerals refer to like elements throughout. In the following description, when the detailed description of the relevant known function or configuration is determined to obscure an important point of the present disclosure unnecessarily, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range is provided.

In describing a position relationship, when a position relation between two parts is described as, for example, "on," "over," "under," or "next," one or more other parts may be disposed between the two parts unless a more limiting term, such as "immediate(ly)" or "direct(ly)," is used. For example, when an element or layer is disposed "on" another element or layer, a third layer or element may be interposed therebetween.

Although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

A size and a thickness of each component illustrated in the drawings are illustrated for convenience of description, and the present disclosure is not limited to the size and the thickness of the component illustrated, unless otherwise stated.

Features of various embodiments of the present disclosure may be partially or overall coupled to or combined with each other, and may be variously inter-operated with each other and driven technically, as those skilled in the art can sufficiently understand. Embodiments of the present disclosure may be carried out independently from each other, or may be carried out in association with each other.

Hereinafter, a display device according to example embodiments of the present disclosure will be described in detail with reference to accompanying drawings.

<Display Device-Rollable Display Device>

A rollable display device may refer to a display device which can display an image even in a rolled state. The rollable display device may have higher flexibility than conventional typical display devices. Depending on whether the rollable display device is in use, a shape of the rollable display device may be freely varied. Specifically, when the rollable display device is not in use, the rollable display device may be rolled to be stored with a reduced volume. On the other hand, when the rollable display device is in use, the rolled rollable display device may be unrolled to be used, e.g., to display images.

Figure 1B:
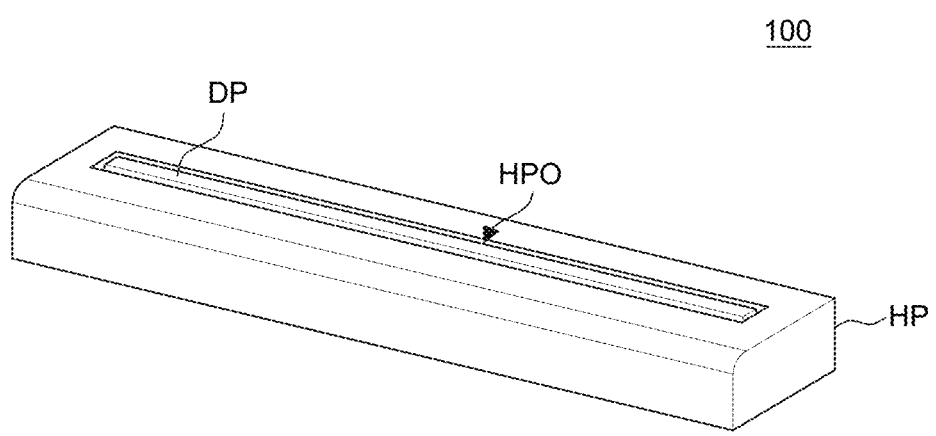

FIG. 1A and FIG. 1B are perspective views of a display device according to an example embodiment of the present disclosure. As shown in FIG. 1A and FIG. 1B, a display device 100 according to an example embodiment of the present disclosure includes a display part DP and a housing part HP.

The display part DP is configured to display images to a user. For example, display elements, circuits for driving the display elements, lines, and other components may be disposed in the display part DP. The display device 100 here according to an example embodiment of the present disclosure is a rollable display device 100. Therefore, the display part DP may be configured to be wound and unwound. For example, the display part DP may include a display panel and a back cover which are flexible so as to be wound or unwound. The display part DP will be described below in more detail with reference to FIGS. 5 through 7B.

The housing part HP serves as a case where the display part DP can be housed. The display part DP may be wound and then housed inside the housing part HP, for example, as shown in FIG. 1B. Also, the display part DP may be unwound and then presented outside the housing part HP, for example, as shown in FIG. 1A.

The housing part HP may include an opening HPO through which the display part DP can move in and out of the housing part HP. The display part DP can move up and down through the opening HPO of the housing part HP.

The display part DP of the display device 100 may be converted from a fully unwound state to a fully wound state, and vice versa.

FIG. 1A shows a fully unwound state of the display part DP of the display device 100. The fully unwound state refers to a state in which the display part DP of the display device 100 is presented outside the housing part HP. That is, the fully unwound state can be viewed as a state in which the display part DP is unwound to a maximum extent so as not to be further unwound and is presented outside the housing part HP in order for the user to watch images on the display device 100.

FIG. 1B shows a fully wound state of the display part DP of the display device 100. The fully wound state refers to a state in which the display part DP of the display device 100 is housed inside the housing part HP so as not to be further wound. That is, the fully wound state may be viewed as a state in which the display part DP is wound and housed inside the housing part HP. When the user is not watching images on the display device 100, it is preferable for the sake of external appearance to have the display part DP housed inside the housing part HP. Further, in the fully wound state in which the display part DP is housed inside the housing part HP, the display device 100 is reduced in volume and easy to transport.

A moving part for winding or unwinding the display part DP to change the display part DP between the fully unwound state and the fully wound state is provided in an example embodiment.

<Moving Part>

Figure 2:
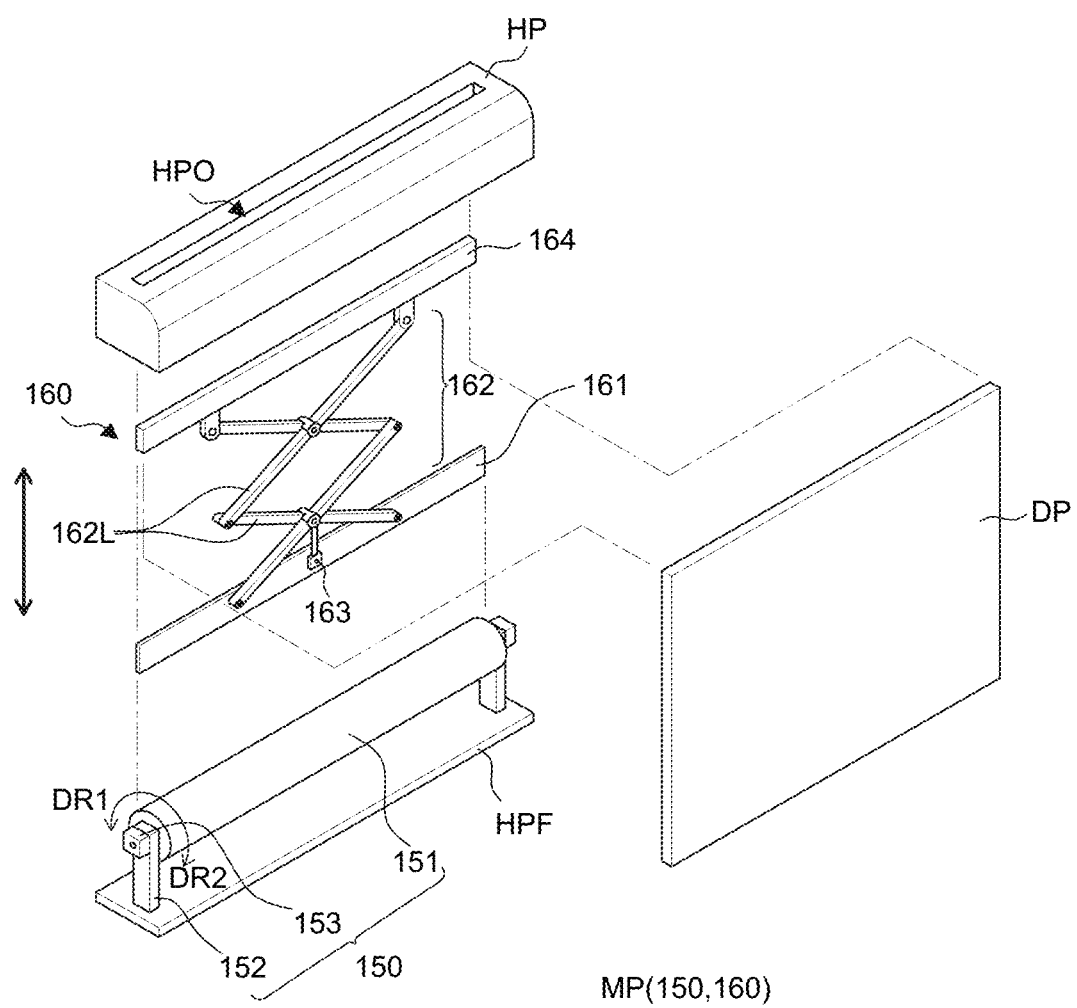
FIG. 2 is an exploded perspective view of the display device according to an example embodiment of the present disclosure.
Figure 3:
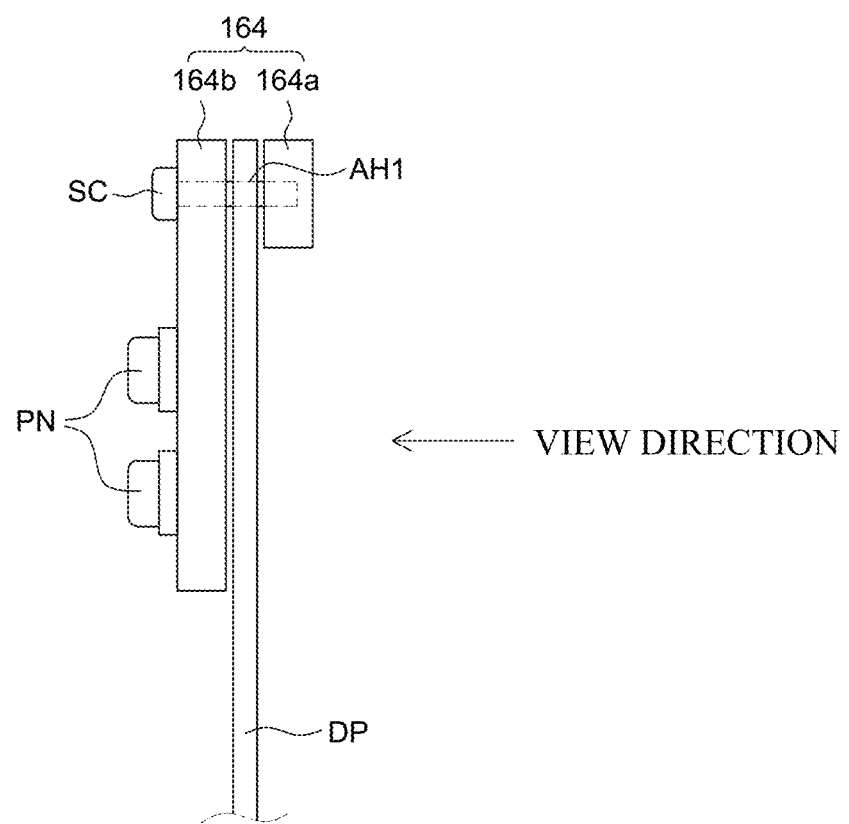
FIG. 3 is a schematic cross-sectional view provided to explain a head bar and a display part of the display device according to an example embodiment of the present disclosure.
Figure 4:
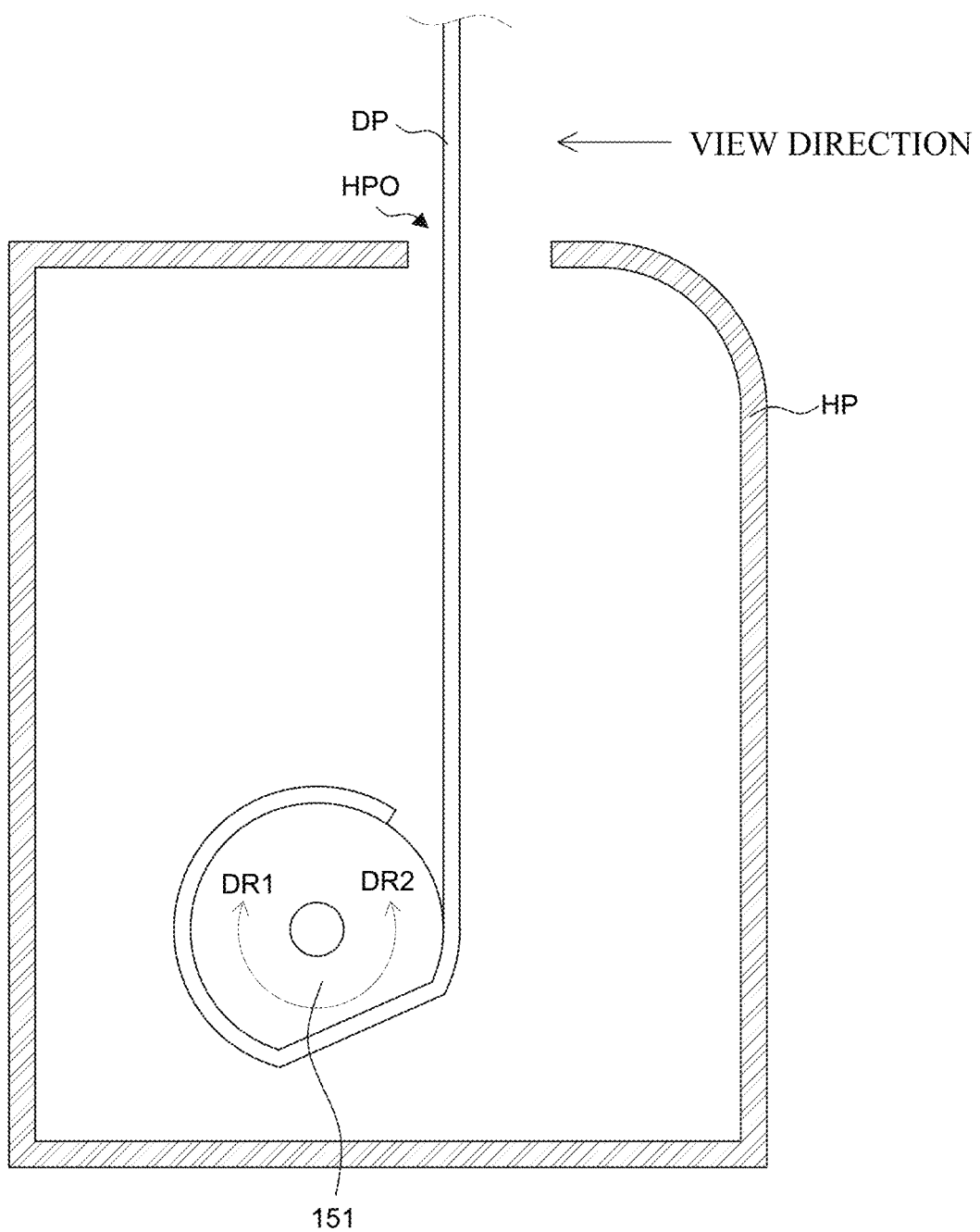
FIG. 4 is a cross-sectional view of the display device according to an example embodiment of the present disclosure.

FIG. 2 is an exploded perspective view of the display device according to an example embodiment of the present disclosure. FIG. 3 is a schematic cross-sectional view provided to explain a head bar and a display part of the display device according to an example embodiment of the present disclosure. FIG. 4 is a cross-sectional view of the display device according to an example embodiment of the present disclosure. FIG. 4 is a schematic cross-sectional view provided to explain a roller 151 and the display part DP of the display device 100 according to an example embodiment of the present disclosure. For convenience of description, FIG. 3 illustrates only a head bar 164 and the display part DP, and FIG. 4 illustrates only the housing part HP, the roller 151, and the display part DP.

First, as illustrated in FIG. 2, a moving part MP may include a roller unit 150 and an elevating unit 160.

The roller unit 150 may wind or unwind the display part DP fixed to the roller unit 150 while rotating in a first direction DR1 or a second direction DR2. The roller unit 150 may include the roller 151, a roller supporting unit 152, and a roller rotating unit 153.

The roller 151 is a member around which the display part DP may be wound. The roller 151 may have, e.g., a cylindrical shape. The lower edge of the display part DP may be fixed to the roller 151. When the roller 151 rotates, the display part DP whose lower edge is fixed to the roller 151 may be wound around the roller 151. On the other hand, when the roller 151 rotates in the opposite direction, the display part DP wound around the roller 151 may be unwound from the roller 151.

As shown in FIG. 4, the roller 151 may have a cylindrical shape overall but may be partially flat. That is, a part of the outer peripheral surface of the roller 151 may be flat, and the other part of the outer peripheral surface may be curved. However, the present disclosure is not limited thereto. The roller 151 may be a completely cylindrical shape or may have any shape around which the display part DP can be wound, but is not limited thereto. The roller 151 will be described below in more detail with reference to FIGS. 9A through 9C.

The roller supporting units 152 may support the roller 151 from both sides of the roller 151. Specifically, the roller supporting units 152 may be placed on a bottom surface HPF of the housing part HP. Further, upper side surfaces of the respective roller supporting units 152 may be combined with respective ends of the roller 151. Thus, the roller supporting units 152 may support the roller 151 to be spaced apart from the bottom surface HPF of the housing part HP. Here, the roller 151 may be rotatably combined with the roller supporting unit 152.

The roller rotating unit 153 may rotate the roller 151 in the first direction DR1 or the second direction DR2. The roller rotating unit 153 may be placed on one or each of the pair of roller supporting units 152. For example, the roller rotating unit 153 may be a rotary motor that transfers rotatory power to the roller 151, but is not limited thereto.

The elevating unit 160 may move the display part DP up and down according to driving of the roller unit 150. The elevating unit 160 may include a link supporting unit 161, a link unit 162, a link elevating unit 163, and the head bar 164.

The link supporting unit 161 may support the link unit 162 and the link elevating unit 163. Specifically, the link supporting unit 161 may support the link unit 162 which may move up and down so that the display part DP does not collide with the boundary of the opening HPO of the housing part HP. The link supporting unit 161 may support the link unit 162 and the display part DP to be movable only up and down but not forward and backward.

The link unit 162 may include a plurality of links 162L hinged to each other. The plurality of links 162L may be rotatably hinged to each other respectively and can be moved up and down by the link elevating unit 163. When the link unit 162 moves up and down, the plurality of links 162L may rotate in a direction to be farther from or closer to each other. More details thereof will be described below with reference to FIG. 4.

The link elevating unit 163 may move the link unit 162 up and down. The link elevating unit 163 may rotate the plurality of links 162L of the link unit 162 to be closer to or farther away from each other, respectively. The link elevating unit 163 may move the link unit 162 up or down to move the display part DP connected to the link unit 162 up or down.

Here, driving of the link elevating unit 163 may be synchronized with driving of the roller rotating unit 153. Thus, the roller unit 150 and the elevating unit 160 may be driven at the same time. For example, when the display part DP is switched from the fully unwound state to the fully wound state, the roller unit 150 may be driven to wind the display part DP around the roller 151. At the same time, the elevating unit 160 may rotate the plurality of links 162L of the link unit 162 to move the display part DP down. Further, when the display part DP is switched from the fully wound state to the fully unwound state, the roller unit 150 may be driven to unwind the display part DP from the roller 151. At the same time, the elevating unit 160 may rotate the plurality of links 162L of the link unit 162 to move the display part DP up.

The head bar 164 of the elevating unit 160 may be fixed to the uppermost end of the display part DP. The head bar 164 may be connected to the link unit 162 and may move the display part DP up and down according to a rotation of the plurality of links 162L of the link unit 162. That is, the display part DP can be moved up and down by the head bar 164, the link unit 162, and the link elevating unit 163.

As illustrated in FIG. 3, the head bar 164 may be placed on the uppermost end of the display part DP to cover a portion of a front surface and a portion of a rear surface of the display part DP.

The head bar 164 may include a first head bar 164a and a second head bar 164b. The first head bar 164a may cover a front surface of the display part DP. The first head bar 164a may cover only a part of the front surface adjacent to the uppermost edge of the display part DP in order not to cover images displayed on the front surface of the display part DP.

The second head bar 164b may cover a portion of a rear surface of the display part DP. The second head bar 164b may cover only a part of the rear surface adjacent to the uppermost edge of the display part DP. However, since images are not displayed on the rear surface of the display part DP, the second head bar 164b may overlap a larger portion of the display part DP than the first head bar 164a.

To fasten the display part DP to the first head bar 164a and the second head bar 164b, first alignment holes AH1 may be formed in the display part DP. Further, screws SC may penetrate the first alignment holes AH1 to fasten the first head bar 164a, the display part DP, and the second head bar 164b together.

The second head bar 164b may include pem nuts PN to which the link unit 162 of the elevating unit 160 may be fastened. The second head bar 164b and link unit 162 of the elevating unit 160 may be fastened to each other by the pem nuts PN. Therefore, when the link unit 162 of the elevating unit 160 moves up and down, the second head bar 164b fastened to the link unit 162 and the first head bar 164a, and the display part DP fastened to the second head bar 164b may move up and down together.

FIG. 3 illustrates an example in which the first head bar 164a and the second head bar 164b have a straight line shape. However, the first head bar 164a and the second head bar 164b may have various other shapes. The shape of the first head bar 164a and the second head bar 164b is not limited to the example illustrated in FIG. 3. For example, the first head bar 164a and the second head bar 164b may have an inverted "L" shape.

Hereafter, an operation of the moving part MP will be described in detail with reference to FIG. 4.

As shown in FIG. 4, the lower edge of the display part DP may be connected to the roller 151. When the roller 151 is rotated by the roller rotating unit 153 (FIG. 2) in the first direction DR1, i.e., in a clockwise direction, the display part DP may be wound around the roller 151 so that the rear surface of the display part DP can be in close contact with a surface of the roller 151.

On the other hand, when the roller 151 is rotated by the roller rotating unit 153 in the second direction DR2, i.e., in a counterclockwise direction, the display part DP wound around the roller 151 may be unwound from the roller 151 and then presented outside the housing part HP.

In some example embodiments, the moving part MP different in structure from the above-described example moving part MP may be employed in the display device 100. That is, the roller unit 150 and the elevating unit 160 may be changed in configuration as long as the display part DP can be wound and unwound. Some of their components may be omitted or modified, or other components may be added.

<Display Part>

Figure 5:
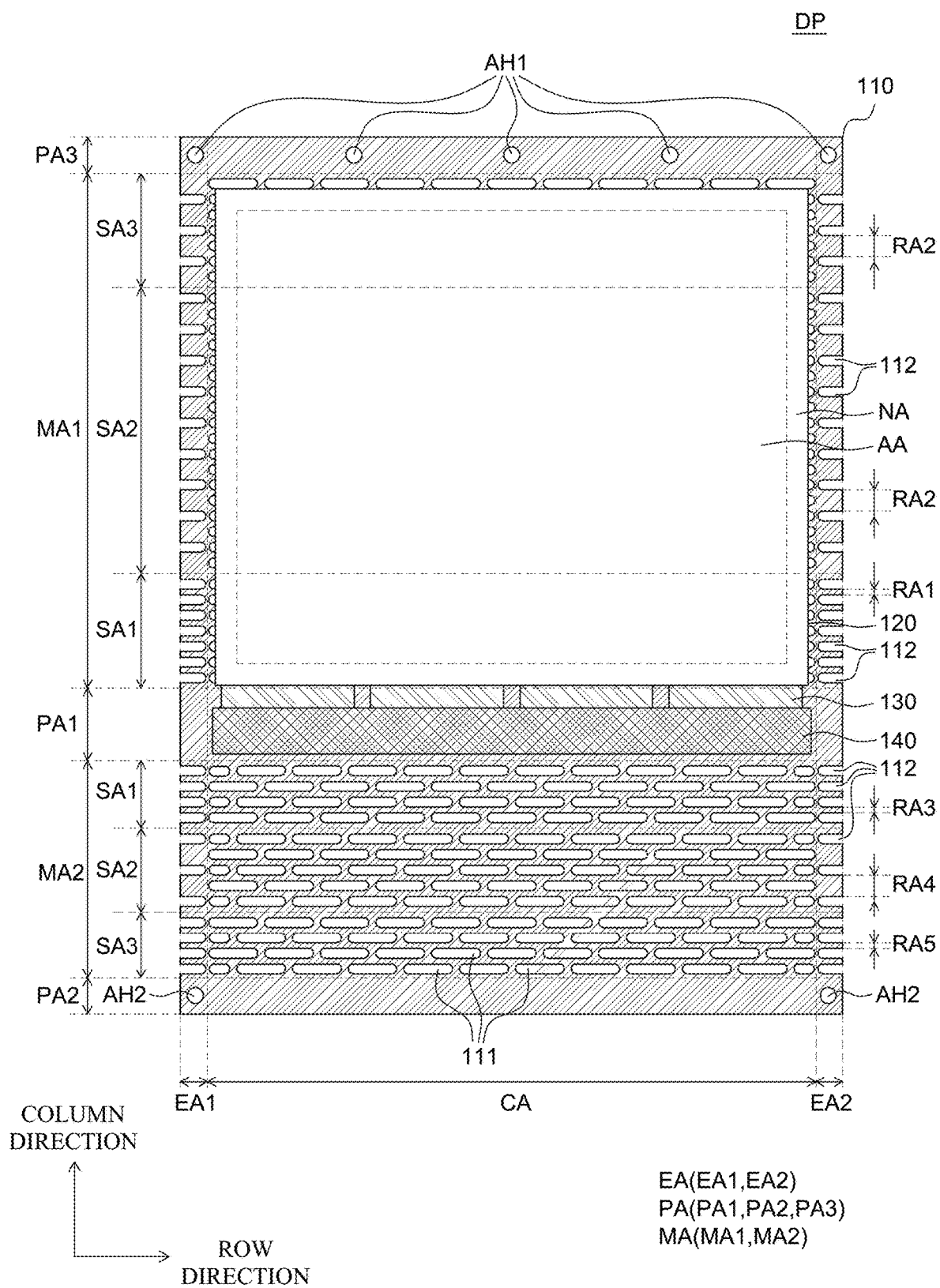
FIG. 5 is a plan view of a display part of the display device according to an example embodiment of the present disclosure.
Figure 6:
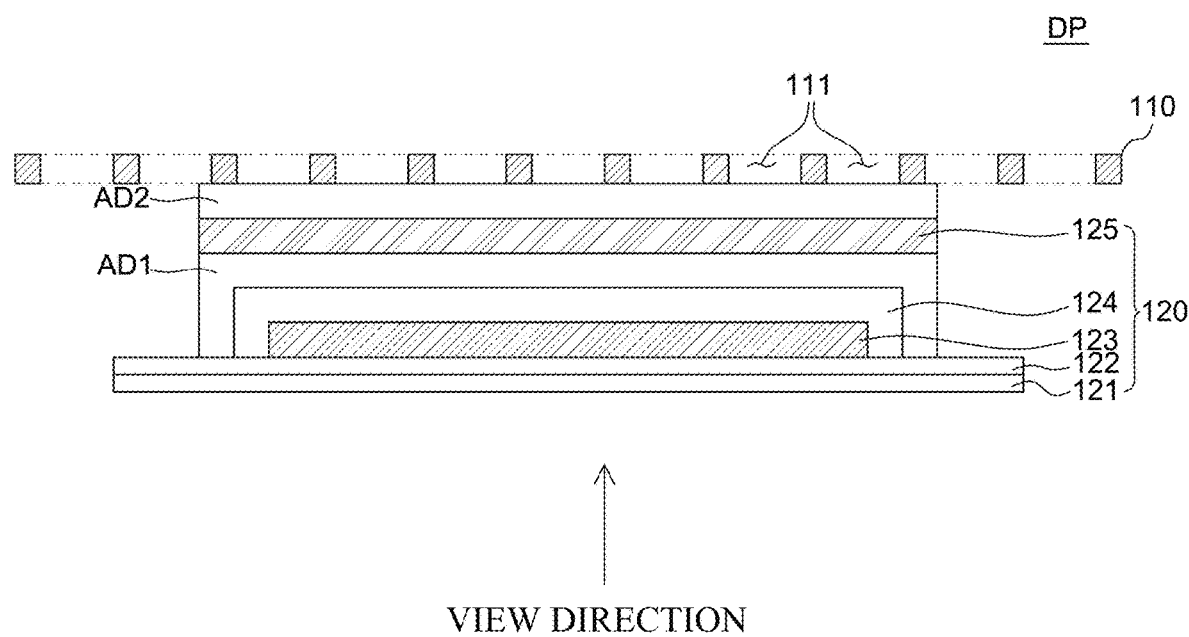
FIG. 6 is a cross-sectional view of the display part of the display device according to an example embodiment of the present disclosure.

FIG. 5 is a plan view of a display part DP of the display device according to an example embodiment of the present disclosure. FIG. 6 is a cross-sectional view of the display part DP of the display device according to an example embodiment of the present disclosure.

As illustrated in FIG. 5, the display part DP may include a back cover 110, a display panel 120, flexible films 130, and a printed circuit board 140.

The display panel 120 may be configured to display images to the user. In the display panel 120, display elements for displaying images, driving elements for driving the display elements, and lines for transmitting various signals to the display elements and the driving elements may be disposed. Different types of display elements may be employed depending on the kind of the display panel 120. For example, if the display panel 120 is an organic light emitting display panel, the display elements may be organic light emitting elements, each composed of an anode, an organic emission layer, and a cathode. As another example, if the display panel 120 is a liquid crystal display panel, the display elements may be liquid crystal display elements. Hereinafter, the display panel 120 may be described as an organic light emitting display panel as an example, but the display panel 120 is not limited to the organic light emitting display panel. Further, since the display device 100 according to an example embodiment of the present disclosure is a rollable display device, the display panel 120 may be implemented as a flexible display panel to be wound around or unwound from the roller 151.

The display panel 120 may include an active area AA and a non-active area NA.

The active area AA refers to an area where an image may be displayed on the display panel 120. In the active area AA, a plurality of sub-pixels and a circuit for driving the plurality of sub-pixels may be disposed. The plurality of sub-pixels may represent a minimum unit of the active area AA, and a display element may be disposed in each of the plurality of sub-pixels. For example, an organic light emitting element composed of an anode, an organic emission layer, and a cathode may be disposed in each of the plurality of sub-pixels, but the present disclosure is not limited thereto. Further, the circuit for driving the plurality of sub-pixels may include, without limitation, a driving element and a line. For example, the circuit may be composed of such elements as a thin film transistor (TFT), a storage capacitor, a gate line, and a data line, but is not limited thereto.

The non-active area NA of the display part 120 is an area where no image can be displayed. In the non-active area NA, various lines and circuits for driving the organic light emitting elements in the active area AA may be disposed. For example, in the non-active area NA, link lines for transmitting signals to the plurality of sub-pixels and circuits in the active area AA or driver ICs such as a gate driver IC and a data driver IC may be disposed. However, non-active area of the present disclosure is not limited thereto.

The flexible films 130 may include various components on a flexible base film and may serve to supply signals to the plurality of sub-pixels and circuits in the active area AA. The flexible films 130 may be electrically connected to the display panel 120. The flexible films 130 may be placed at one end of the non-active area NA of the display panel 120 and may supply power voltage, data voltage, or other voltages or signals to the plurality of sub-pixels and circuits in the active area AA. FIG. 5 illustrates four flexible films 130. However, the number of flexible films 130 is not limited to the illustrated example, and the number of flexible films may vary depending on the design.

On the flexible films 130, driver ICs, such as a gate driver IC and a data driver IC, may be disposed. The driver ICs may be configured to process data for displaying an image and a driving signal for processing the data. The driver ICs may be mounted in a Chip On Glass (COG) method, a Chip On Film (COF) method, a Tape Carrier Package (TCP), or other similar methods. For convenience of description, the driver ICs may be described, for example, as being mounted on the flexible films 130 in the COF method, but the present disclosure is not limited thereto.

The printed circuit board 140 may be disposed on one ends of the flexible films 130 and connected to the flexible films 130. The printed circuit board 140 may be configured to supply signals to the driver ICs. The printed circuit board 140 may supply various signals, such as a drive signal, a data signal, or other signals, to the driver ICs. In the printed circuit board 140, various components may be disposed. For example, a timing controller and a power supply unit, among others, may be disposed on the printed circuit board 140. FIG. 5 illustrates a single printed circuit board 140 as an example. However, the number of printed circuit boards 140 is not limited to the illustrated example and may vary depending on the design.

Although not illustrated in FIG. 5, one or more additional printed circuit boards connected to the printed circuit board 140 may be further disposed. For example, the printed circuit board 140 may be referred to as a source printed circuit board (source PCB) S-PCB on which a data driver is mounted. An additional printed circuit board connected to the printed circuit board 140 may be referred to as a control printed circuit board (control PCB) C-PCB on which a timing controller or the like is mounted. The additional printed circuit board may be disposed inside the roller 151, or may be disposed within the housing part HP outside the roller 151.

The back cover 110 may be disposed on rear surfaces of the display panel 120, the flexible films 130, and the printed circuit board 140, and may support the display panel 120, the flexible films 130, and the printed circuit board 140. Thus, the back cover 110 may be larger in size than the display panel 120. The back cover 110 can protect the other components of the display part DP against the external environment. The back cover 110 may be formed of a rigid material, but at least a part of the back cover 110 may have flexibility to be wound or unwound along with the display panel 120. For example, the back cover 110 may be formed of a metal material, such as Steel Use Stainless (SUS) or Invar, or a plastic material. However, the material of the back cover 110 is not limited thereto. Various different materials may be employed for the back cover 110 depending on the design as long as they can satisfy property characteristics, such as an amount of thermal deformation, a radius of curvature, rigidity, and the like.

As shown in FIG. 6, the display panel 120 may include a substrate 121, a buffer layer 122, a pixel unit 123, an encapsulation layer 124, and an encapsulation substrate 125.

The substrate 121 may serve as a base member to support various components of the display panel 120 and may be formed of an insulating material. The substrate 121 may be formed of a flexible material so that the display panel 120 may be wound or unwound. For example, the substrate 121 may be formed of a plastic material, such as polyimide (PI).

The buffer layer 122 may suppress diffusion of moisture and/or oxygen permeating from the outside of the substrate 121. The buffer layer 122 may be formed as a single layer or a multilayer of silicon oxide (SiOx) and silicon nitride (SiNx), but is not limited thereto.

The pixel unit 123 may include a plurality of organic light emitting elements and circuits for the organic light emitting elements. The pixel unit 123 may be disposed in an area corresponding to the active area AA. Each organic light emitting element may include an anode, an organic emission layer, and a cathode.

The anode may supply holes into the organic emission layer and may be formed of a conductive material having a high work function. For example, the anode may be formed of tin oxide (TO), indium tin oxide (ITO), indium zinc oxide (IZO), indium zinc tin oxide (ITZO), or the like, but is not limited thereto.

The organic emission layer may receive holes from the anode and electrons from the cathode, and emit light. The organic emission layer may be one of a red organic emission layer, a green organic emission layer, a blue organic emission layer, and a white organic emission layer depending on the color of light emitted from the organic emission layer. If the organic emission layer is a white organic emission layer, color filters of various colors may be further provided.

The cathode may supply electrons into the organic emission layer and may be formed of a conductive layer having a low work function. For example, the cathode may be formed of one or more materials selected from a group of metals, such as magnesium (Mg), silver (Ag), and aluminum (Al) and alloys thereof, but is not limited thereto.

The display panel 120 may be classified into a top emission type or a bottom emission type according to a transmission direction of light emitted from the organic light emitting element.

In the top emission type, light emitted from the organic light emitting element may be discharged away from the substrate 121 on which the organic light emitting element is disposed. If the display panel 120 is of top emission type, a reflective layer may be further provided under the anode. This is to discharge light emitted from the organic light emitting element away from the substrate 121, i.e., toward the cathode.

In the bottom emission type, light emitted from the organic light emitting element is discharged toward the substrate 121 on which the organic light emitting element is formed. If the display panel 120 is of bottom emission type, the anode may be formed of a transparent conductive material only and the cathode may be formed of a metal material having high reflectivity. This is to discharge light emitted from the organic light emitting element toward the substrate 121.

Hereafter, for convenience of description, the display device 100 according to an example embodiment of the present disclosure will be described as a bottom emission type display device, but is not limited thereto.

In the pixel unit 123, a circuit for driving organic light emitting elements may be disposed. The circuit may be composed of a TFT, a storage capacitor, a gate line, a data line, a power line, and possibly other components. The components of the circuit may vary depending on the design of the display device 100.

The encapsulation layer 124 may be disposed on and cover the pixel unit 123. The encapsulation layer 124 may seal the organic light emitting elements of the pixel unit 123. The encapsulation layer 124 may protect the organic light emitting elements of the pixel unit 123 against external moisture, oxygen, impacts, and the like. The encapsulation layer 124 may be formed by alternately laminating a plurality of inorganic layers and a plurality of organic layers. For example, the inorganic layers may be formed of inorganic materials, such as silicon nitride (SiNx), silicon oxide (SiOx), and aluminum oxide (AlOx), but are not limited thereto. For example, the organic layers may be formed of epoxy-based or acryl-based polymers, but are not limited thereto.

The encapsulation substrate 125 may be disposed on the encapsulation layer 124. The encapsulation substrate 125 may protect the organic light emitting elements of the pixel unit 123 together with the encapsulation layer 124. The encapsulation substrate 125 may protect the organic light emitting elements of the pixel unit 123 against external moisture, oxygen, impacts, and the like. The encapsulation substrate 125 may be formed of a metal material which has high corrosion resistance and can be easily processed into a foil or a thin film. Examples of the metal material may include aluminum (Al), nickel (Ni), chromium (Cr), and an alloy of iron (Fe) and Ni. Thus, since the encapsulation substrate 125 may be formed of a metal material, the encapsulation substrate 125 can be implemented in the form of an ultra-thin film and can provide high resistance to external impacts and scratches.

A first adhesive layer AD1 may be disposed between the encapsulation layer 124 and the encapsulation substrate 125. The first adhesive layer AD1 may bond the encapsulation layer 124 and the encapsulation substrate 125 to each other. The first adhesive layer AD1 may be formed of an adhesive material and may be a thermosetting or naturally-curable adhesive. For example, the first adhesive layer AD1 may be formed of an optical clear adhesive (OCA), a pressure sensitive adhesive (PSA), or the like, but is not limited thereto.

The first adhesive layer AD1 may be disposed to cover the encapsulation layer 124 and the pixel unit 123. That is, the pixel unit 123 may be sealed by the buffer layer 122 and the encapsulation layer 124, and the encapsulation layer 124 and the pixel unit 123 may be sealed by the buffer layer 122 and the first adhesive layer AD1. The first adhesive layer AD1 may protect the organic light emitting elements of the pixel unit 123 against external moisture, oxygen, impacts, and the like, together with the encapsulation layer 124 and the encapsulation substrate 125. In this case, the first adhesive layer AD1 may further contain a moisture absorbent. The moisture absorbent may include hygroscopic particles and may absorb moisture, oxygen, and the like from the outside to minimize permeation of moisture and oxygen into the pixel unit 123.

The back cover 110 may be disposed on the encapsulation substrate 125. The back cover 110 may be disposed to be in contact with the encapsulation substrate 125 of the display panel 120 to protect the display panel 120. The back cover 110 may be formed of a rigid material to protect the display panel 120.

The back cover 110 may include a plurality of first openings 111 disposed in a central area CA and a plurality of second openings 112 disposed in an edge area EA. The plurality of first openings 111 and the plurality of second openings 112 may allow the back cover 110 to have flexibility. The plurality of first openings 111 and the plurality of second openings 112 may be flexibly deformed and allow the back cover 110 to be more easily wound around or unwound from the roller 151 along with the display panel 120. More details thereof are described below with reference to FIG. 7A and FIG. 7B.

A second adhesive layer AD2 may be disposed between the encapsulation substrate 125 and the back cover 110. The second adhesive layer AD2 may bond the encapsulation substrate 125 and the back cover 110 to each other. The second adhesive layer AD2 may be formed of an adhesive material and may be a thermosetting or naturally-curable adhesive. For example, the second adhesive layer AD2 may be formed of an optical clear adhesive (OCA), a pressure sensitive adhesive (PSA), or the like, but is not limited thereto.

FIG. 6 illustrates that the plurality of first openings 111 of the back cover 110 is not filled with the second adhesive layer AD2. However, some or all of the plurality of first openings 111 of the back cover 110 may be filled with the second adhesive layer AD2. If the second adhesive layer AD2 fills in the plurality of first openings 111 of the back cover 110, a contact area between the second adhesive layer AD2 and the back cover 110 increases. Thus, it is possible to prevent or suppress separation between the back cover 110 and the display panel 120.

Although not illustrated in FIG. 6, a transparent film may be further disposed on a front surface of the substrate 121 (i.e., a lower surface of the substrate 121 as illustrated in FIG. 6). The transparent film may function to protect a front surface or a viewing surface of the display panel 120 or minimize reflection of external light incident on the display panel 120. For example, the transparent film may be at least one of a polyethyleneterephthalate (PET) film, an antireflection film, a polarizing film, and a transmittance controllable film, but is not limited thereto.

Hereafter, the back cover 110 will be described in more detail with reference to FIG. 7A and FIG. 7B.

<Detailed Configuration of an Example Back Cover>

Figure 7A:
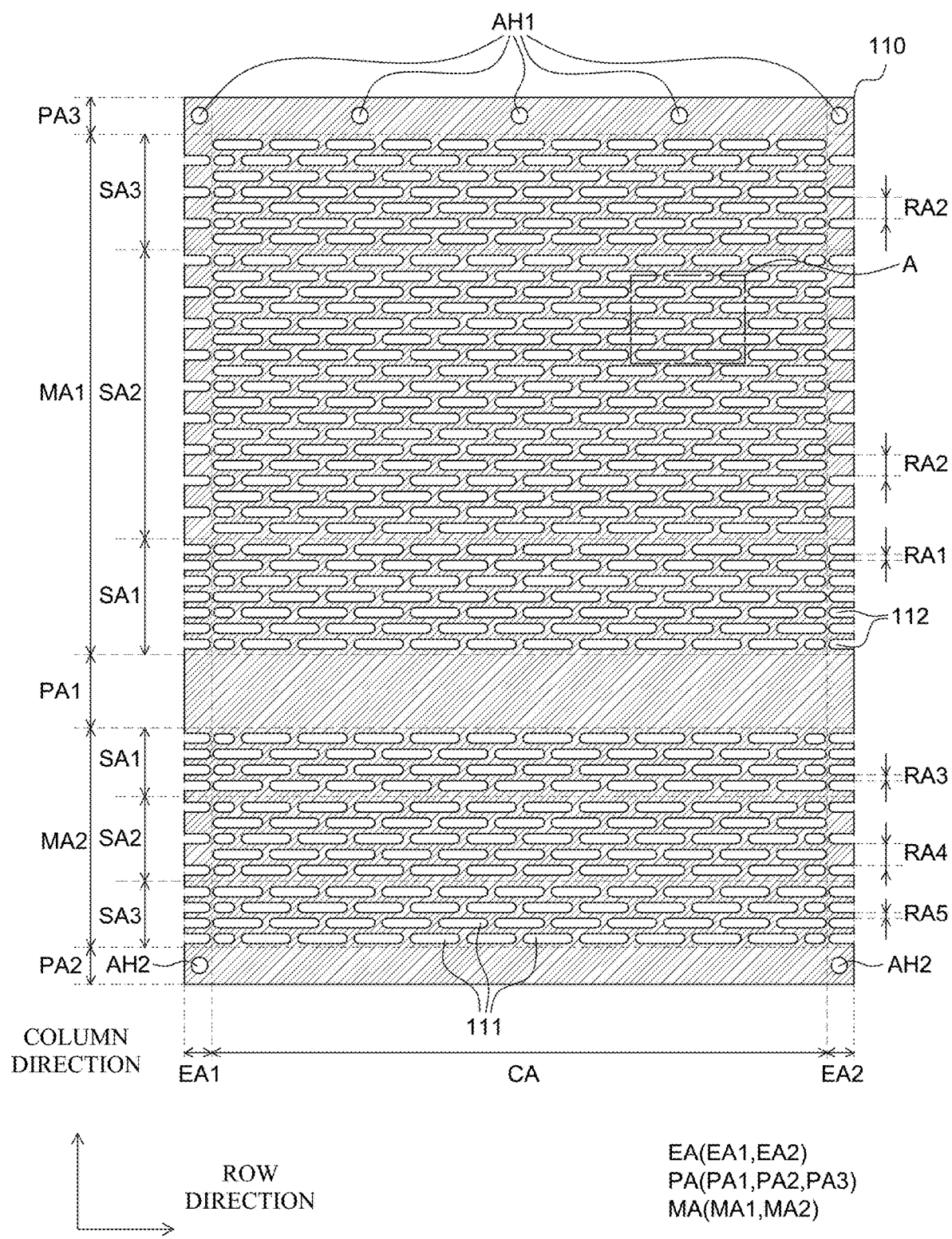
FIG. 7A is a plan view of a back cover of the display device according to an example embodiment of the present disclosure.

FIG. 7A is a plan view of a back cover of the display device according to an example embodiment of the present disclosure. FIG. 7B is an enlarged view of a region "A" of FIG. 7A.

As illustrated in FIG. 7A, the back cover 110 may include a supporting area PA and a flexible area MA. Specifically, in the supporting area PA of this example embodiment, the plurality of first openings 111 and the plurality of second openings 112 are not disposed. In the flexible area MA, the plurality of first openings 111 and the plurality of second openings 112 may be disposed. In this case, the back cover 110 may include a third supporting area PA3 on the uppermost end, a second supporting area PA2 on the lowermost end, and a first supporting area PA1 between the third supporting area PA3 and the second supporting area PA2. The back cover 110 also may include the flexible area MA between the third flexible area PA3 and the first supporting area PA1 and between the second supporting area PA2 and the first supporting area PA1.

As shown in FIG. 7A, the third supporting area PA3 of the back cover 110 is the uppermost area of the back cover 110 and may be fastened to the head bar 164. The third supporting area PA3 may include the first alignment holes AH1 to be fastened with the head bar 164. Further, as described above with reference to FIG. 3, the screws SC penetrating the head bar 164 and the first alignment holes AH1 may be provided to fasten the head bar 164 to the third supporting area PA3 of the back cover 110. Further, since the third supporting area PA3 may be fastened to the head bar 164, the back cover 110 can move up or down at the same time when the link unit 162 clamped to the head bar 164 moves up or down. The display panel 120 attached to the back cover 110 can also move up or down. FIG. 7A illustrates five first alignment holes AH1 as an example, but the number of first alignment holes AH1 may vary and is not limited to this illustrated example. Further, FIG. 7A illustrates that the back cover 110 may be fastened to the head bar 164 using the first alignment holes AH1. However, the present disclosure is not limited thereto. The back cover 110 may be attached to the head bar 164 without alignment holes.

As shown in FIG. 7A, the second supporting area PA2 of the back cover 110 is the lowermost area of the back cover 110 and may be fixed to the roller 151. The second supporting area PA2 may include second alignment holes AH2 to be fastened to the roller 151. For example, screws SC penetrating the roller 151 and the second alignment holes AH2 may be provided to fasten the roller 151 to the second supporting area PA2 of the back cover 110. Further, since the second supporting area PA2 may be fastened to the roller 151, the back cover 110 may be wound around or unwound from the roller 151 by rotation of the roller 151. FIG. 7A illustrates two second alignment holes AH2 as an example, but the number of second alignment holes AH2 may vary and is not limited to the illustrated example.

The first supporting area PA1 may be disposed between the third supporting area PA3 and the second supporting area PA2. The flexible films 130 connected to one end of the display panel 120 and the printed circuit board 140 may be attached to the first supporting area PA1.

The first supporting area PA1 may enable the flexible films 130 and the printed circuit board 140 to be wound flat around the roller 151, without being curved, to protect the flexible films 130 and the printed circuit board 140. Further, the roller 151 may also be partially flat to correspond to the first supporting area PA1 and to maintain the first supporting area PA1 flat. Details thereof are described below with reference to FIGS. 8A through 8C.

The flexible area MA of the back cover 110 may be wound around or unwound from the roller 151 together with the display panel 120. The flexible area MA may overlap at least the display panel 120 among the other components of the display part DP.

As illustrated in FIG. 7A, the flexible area MA of the back cover 110 may include the central area CA and the edge area EA on both sides of the central area CA. That is, the edge area EA may include a left edge area EA1 on the left of the central area CA of the flexible area MA and a right edge area EA2 on the right of the central area CA. The central area CA may correspond to where the display panel 120 is disposed, and the edge area EA may be the other area of the flexible area MA excluding the central area CA.

The plurality of first openings 111 may be disposed in the central area CA of the flexible area MA. During winding or unwinding of the display part DP, the plurality of first openings 111 may be deformed by stress applied to the display part DP. Specifically, during winding or unwinding of the display part DP, the flexible area MA of the back cover 110 may be deformed as the plurality of first openings 111 contracts or expands. Further, since the plurality of first openings 111 may contract or expand, a slip phenomenon of the display panel 120 disposed on the flexible area MA of the back cover 110 can be minimized or suppressed. Therefore, stress applied to the display panel 120 can be minimized or suppressed.

During winding of the display panel 120 and the back cover 110, there may be a difference in length between the display panel 120 and the back cover 110 which are wound around the roller 151. This is because there is a difference in radius of curvature between the display panel 120 and the back cover 110. For example, if the back cover 110 and the display panel 120 are wound around the roller 151, the back cover 110 and the display panel 120 may need different lengths to be wound once around the roller 151. That is, the display panel 120 is disposed farther away from the roller 151 than the back cover 110 and thus may need a larger length to be wound once around the roller 151 than the back cover 110. As such, a difference in radius of curvature during winding of the display part DP may cause a difference in length for winding of the back cover 110 and the display panel 120. Thus, the display panel 120 attached to the back cover 110 may slip and move from its original position. In this case, a phenomenon that the display panel 120 slips from the back cover 110 due to differences in stress and radius of curvature caused by winding may be defined as slip phenomenon. If an excessive slip occurs, the display panel 120 may be detached from the back cover 110 or defects such as cracks may occur.

In this case, in the display device 100 according to an example embodiment of the present disclosure, even if the display part DP is applied with stress while being wound or unwound, the plurality of first openings 111 of the back cover 110 may be flexibly deformed to reduce stress applied to the back cover 110 and the display panel 120. For example, when the back cover 110 and the display panel 120 are wound around the roller 151, stress that deforms the back cover 110 and the display panel 120 in up and down directions may be applied thereto. In this case, the plurality of first openings 111 of the back cover 110 may expand in the up and down directions of the back cover 110 and the length of the back cover 110 may also be flexibly changed. Therefore, during winding of the back cover 110 and the display panel, the plurality of first openings 111 of the back cover 110 may compensate for a difference in length between the back cover 110 and the display panel 120 caused by a difference in radius of curvature. Further, during winding of the back cover 110 and the display panel 120, the plurality of first openings 111 may be deformed to reduce stress applied to the display panel 120 from the back cover 110.

Figure 7B:
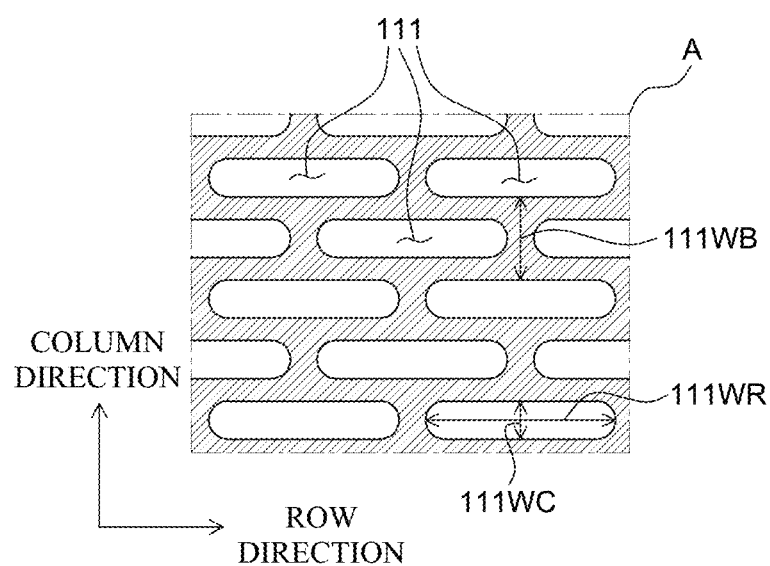
FIG. 7B is an enlarged view of a region "A" of FIG. 7A.

As illustrated in FIG. 7A and FIG. 7B, the plurality of first openings 111 may be staggered with the plurality of first openings 111 of adjacent rows. For example, the plurality of first openings 111 of one row is staggered with the plurality of first openings 111 of rows adjacent to the corresponding row. Specifically, the centers of plurality of first openings 111 in odd-numbered rows may be offset from the centers of the plurality of first openings 111 in even-numbered rows by as much as, e.g., ½ of the width 111WR (see, e.g., FIG. 7B) of each opening 111 in a row-direction. The placement and arrangement of the plurality of first openings 111 are shown in FIG. 7A as an example only, and are not limited thereto.

Since the plurality of first openings 111 in one row may be staggered with the first openings 11 in an adjacent row, a distance 111WB (wee, e.g., FIG. 7B) between the two adjacent first openings 111 with their centered aligned in the column direction can be reduced or minimized. Specifically, in the flexible areas MA, an area between the plurality of first openings 111 with their centers aligned in the column direction may have rigidity. Further, during winding of the back cover 110, the back cover 110 is bent in the column direction. Thus, as the length 111WB of the area between two adjacent first openings 111 aligned in the column direction increases, it may become more difficult for the back cover 110 to be bent in the column direction. In this case, since the plurality of first openings 111 is staggered from row to row, the distance 111WB between the plurality of first openings 111 aligned in the column direction can be reduced or minimized, compared to an arrangement in which the first openings 111 are not staggered from row to row. Also, the area between the plurality of first openings 111 can be reduced or minimized. Therefore, the distance 111WB between the plurality of first openings 111 aligned in the column direction may be reduced or minimized, and the flexible areas MA may be extended continuously in the column direction to remove or reduce the area where the plurality of first openings 111 is not disposed. Also, because the length 111WB of the area between the plurality of first openings 111 having rigidity in the column direction can be reduced or minimized, the overall rigidity of the back cover 110 can be improved without interfering with winding or unwinding of the back cover 110.

As illustrated in FIG. 7B, the maximum width 111WR of the plurality of first openings 111 in the row direction may be larger than the maximum width 111WC in the column direction. That is, as shown in FIG. 7B, the maximum width 111WR of the plurality of first openings 111 in a transverse or the row direction may be larger than the maximum width 111WC of the plurality of first openings 111 in a vertical or the column direction.

As the width 111WR of the plurality of first openings 111 in the row direction increases, it may become easier for the back cover 110 to be flexibly deformed. Specifically, during winding of the back cover 110, the back cover 110 may be bent in the column direction, and stress may be applied to expand the plurality of first openings 111 in the column direction. In this case, if the width 111WR of the plurality of first openings 111 in the row direction increases, when the plurality of first openings 111 is stretched in the column direction, the column-direction width 111WC of the plurality of first openings 111 may increase by a greater amount. Further, as the plurality of first openings 111 expands in the column direction, stress applied to the plurality of flexible areas MA may be reduced. Therefore, by increasing the row-direction width 111WR of the plurality of first openings 111, the plurality of flexible areas MA of the back cover 110 can be more easily wound or unwound, and stress applied to the flexible areas MA can be reduced.

As the column-direction width 111WC of the plurality of first openings 111 increases, the plurality of first openings 111 may be more easily formed. However, if the column-direction width 111WC of the plurality of first openings 111 increases, the aperture ratio of the plurality of first openings 111 in the flexible areas MA may increase. Also, a contact area between the display panel 120 and the back cover 110 which are attached to the flexible areas MA may decrease. In this case, if an overlap area between the display panel 120 and the back cover 110, i.e., a contact area between the back cover 110 and the second adhesive layer AD2, decreases, the back cover 110 may be separated from the second adhesive layer AD2. Therefore, the column-direction width 111WC of the plurality of first openings 111 may be controlled to control adhesive strength between the display panel 120 and the back cover 110 to suppress or prevent separation therebetween. Further, the row-direction width 111WR of the plurality of first openings 111 may be controlled such that the back cover 110 can have high flexibility.

In this case, the plurality of first openings 111 may be formed in the flexible area MA, but not in the third supporting area PA3 or the second supporting area PA2. That is, the first alignment holes AH1 and the second alignment holes AH2 may be formed in the third supporting area PA3 and the second supporting area PA2, respectively. However, the plurality of first openings 111 formed in the flexible area MA is not formed in the third supporting area PA3 or the second supporting area PA2. Further, the first alignment holes AH1 and the second alignment holes AH2 may be different in shape from the plurality of first openings 111. The third supporting area PA3 and the second supporting area PA2 may be fixed to the head bar 164 and the roller 151, respectively. Thus, the third supporting area PA3 and the second supporting area PA2 may have higher rigidity than the flexible area MA. Specifically, since the third supporting area PA3 and the second supporting area PA2 have higher rigidity, the third supporting area PA3 and the second supporting area PA2 can be securely fixed to the head bar 164 and the roller 151, respectively. Therefore, the display part DP may be fixed to the roller 151 and the head bar 164 of the moving part MP, and can move in and out of the housing part HP according to an operation of the moving part MP.

In the display device 100 according to an example embodiment of the present disclosure, the back cover 110 including the plurality of first openings 111 may be disposed on the rear surface of the display panel 120 to support and protect the display panel 120. The back cover 110 may be formed of a metal material and thus may have rigidity. Also, the flexible area MA of the back cover 110 in which the display panel 120 is disposed may include the plurality of first openings 111, and the back cover 110 may accordingly have improved flexibility. Therefore, in the fully unwound state in which the display part DP of the display device 100 is presented outside the housing part HP, the back cover 110 formed of a rigid material and having high rigidity may support the display panel 120 to be spread flat. On the other hand, in the fully wound state in which the display part DP of the display device 100 is housed inside the housing part HP, the back cover 110 having high flexibility due to the plurality of first openings 111 may be wound around the roller 151 and be housed together with the display panel 120 in the housing part HP.

In addition, in the display device 100 according to an example embodiment of the present disclosure, the row-direction width 111WR of the plurality of first openings 111 may be controlled such that the back cover 110 can have flexibility. Further, stress applied to the back cover 110 during a winding operation can be reduced. Specifically, during winding of the back cover 110 and the display panel 120 around the roller 151, the back cover 110 may be bent in the column direction, and stress may be applied to expand the plurality of first openings 111 in the column direction. Since the plurality of first openings 111 has a relatively large row-direction width 111WR, the plurality of first openings 111 can more easily expand in the column direction during winding of the back cover 110 and the display panel 120 around the roller 151, thereby reducing the stress applied to the back cover 110. Therefore, in the display device 100 according to an example embodiment of the present disclosure, by controlling the row-direction width 111WR of the plurality of first openings 111, the flexibility of the back cover 110 can be improved, and the back cover 110 and the display panel 120 can be more easily wound around the roller 151. Further, since the plurality of first openings 111 can reduce stress applied to the back cover 110 and the display panel 120 while expanding in the column direction, damage to the display panel 120 can be suppressed.

Furthermore, in the display device 100 according to an example embodiment of the present disclosure, the column-direction width 111WC of the plurality of first openings 111 may be controlled to control adhesive strength between the back cover 110 and the display panel 120. Specifically, the display panel 120 may be attached to the flexible area MA of the back cover 110. In this case, as the aperture ratio of the plurality of first openings 111 in the flexible area MA increases, a contact area between the display panel 120 and the back cover 110 decreases. Thus, the adhesive strength between the display panel 120 and the back cover 110 may decrease. However, in the display device 100 according to an example embodiment of the present disclosure, the plurality of first openings 111 in the back cover 110 may have a relatively small column-direction width 111WC. Thus, the aperture ratio of the plurality of first openings 111 can be reduced, and the contact area between the display panel 120 and the back cover 110 can be increased. As the contact area between the display panel 120 and the back cover 110 increases, the adhesive strength between the display panel 120 and the back cover 110 can be improved. Therefore, in the display device 100 according to an example embodiment of the present disclosure, by controlling the column-direction width 111WC of the plurality of first openings 111, the adhesive strength between the back cover 110 and the display panel 120 can be maintained at a certain level or higher to suppress separation therebetween.

As shown in FIG. 7A, the left edge area EA1 and the right edge area EA2 are disposed on the left and right sides, respectively, of the central area CA of the flexible area MA. The edge area EA may have a smaller row-direction width than the central area CA.

The plurality of second openings 112 may be disposed in the edge area EA of the flexible area MA. A distance between the plurality of second openings 112 in the edge area EA may be adjusted selectively depending on the location of the second opening 112.

The flexible area MA of the back cover 110 may include a first flexible area MA1 between the third supporting area PA3 and the first supporting area PA1 and a second flexible area MA2 between the second supporting area PA2 and the first supporting area PA1.

The first flexible area MA1 may extend from the first supporting area PA1 to the upper side of the back cover 110. In the first flexible area MA1, the plurality of first openings 111 and the plurality of second openings 112 may be disposed. The display panel 120 may be attached to the first flexible area MA1.

The second flexible area MA2 may extend from the first supporting area PA1 to the lower side of the back cover 110. In the second flexible area MA2, the plurality of first openings 111 and the plurality of second openings 112 may be disposed, but the display panel 120 is not disposed. The second flexible area MA2 may extended or unwound to enable the active area AA of the display panel 120 to be presented outside the housing part HP. For example, when the back cover 110 and the display panel 120 are in the fully wound state, an area ranging from the second supporting area PA2 of the back cover 110 fixed to the roller 151 to the first supporting area PA to which the flexible films 130 and the printed circuit board 140 are attached may be placed inside the housing part HP. On the other hand, when the back cover 110 and the display panel 120 are in the fully unwound state, an area ranging from the first flexible area MA1 to which the display panel 120 is attached to the third supporting area PA3 may be presented outside the housing part HP. In this case, if a length from the second supporting area PA2 fixed to the roller 151 through the second flexible area MA2 to the first supporting area PA1 is smaller than a length from the second supporting area PA2 to the opening HPO of the housing part HP, a part of the first flexible area MA1 to which the display panel 120 is attached may remain inside the housing part HP even in the fully unwound state. If a part of a lower end of the active area AA of the display panel 120 remains inside the housing part HP, it may be difficult to watch the full images displayed on the display panel 120. Therefore, the length from the second supporting area PA2 fixed to the roller 151 through the second flexible area MA2 to the first supporting area PA1 may be designed to be substantially equal to the length from the second supporting area PA2 fixed to the roller 151 to the opening HPO of the housing part HP.

As illustrated in FIG. 7A, the first flexible area MA1 may include a first sub-flexible area SA1, a second sub-flexible area SA2, and a third sub-flexible area SA3.

The first sub-flexible area SA1 of the first flexible area MA1 may extend upward from the first supporting area PA1. The second sub-flexible area SA2 of the first flexible area MA1 may extend upward from the first sub-flexible area SA1. The third sub-flexible area SA3 of the first flexible area MA1 may extend from the second sub-flexible area SA2 to the third supporting area PA3. In this case, when the back cover 110 is fully unwound, the first flexible area MA1 may be entirely disposed outside the housing part HP. Further, when the back cover 110 is fully wound, the first sub-flexible area SA1 and the second sub-flexible area SA2 of the first flexible area MA1 may be wound around the roller 151. However, even in the fully wound state, the third sub-flexible area SA3 of the first flexible area MA1 and the third supporting area PA3 may not be wound around the roller 151, and instead maintain a flat state. Details thereof are described below with reference to FIGS. 8A through 8C.

When the back cover 110 is wound around the roller 151 and the first supporting area PA1 is disposed on a flat surface of the roller 151, the first sub-flexible area SA1 of the first flexible area MA1 may be disposed on a curved surface adjacent to the flat surface of the roller 151. In this case, the interface between the flat surface and the curved surface of the roller 151 may have the smallest radius of curvature. Thus, the back cover 110 may be damaged by increased stress generated during a winding operation. Therefore, a distance RA1 between the plurality of second openings 112 disposed in the first sub-flexible area SA1 of the first flexible area MA1 may be set relatively small. That is, the distance RA1 between the plurality of second openings 112 disposed in the first sub-flexible area SA1 of the edge area EA of the back cover 110 is set small to minimize or suppress stress generated when the back cover 110 is disposed on the roller 151 during a winding operation. Thus, it is possible to minimize or suppress damage to the back cover 110.

As described above, when the back cover is fully unwound, the second sub-flexible area SA2 and the third sub-flexible area SA3 of the first flexible area MA1 may be disposed outside the housing part HP. Therefore, when the user watches images on the display panel 120, the second sub-flexible area SA2 and the third sub-flexible area SA3 of the first flexible area MA1 may be disposed behind the display panel 120 and be visible to the user. In this case, if a distance RA2 between the plurality of second openings 112 disposed in the second sub-flexible area SA2 and the third sub-flexible area SA3 of the first flexible area MA1 is small, the user may feel a sense of inconsistency.

Further, the edge area EA of the back cover 110 is the outermost portion of the display part DP. A side portion of the back cover 110 may have a sharp pattern due to the plurality of second openings 112. Particularly, if the distance RA2 between the plurality of second openings 112 is small, the pattern in the side portion of the back cover 110 decreases in width in the column direction and thus may have a sharper shape. Therefore, the side portion of the back cover 110 may be more vulnerable to external impacts and may be more easily deformed. Also, there may be a greater risk of injury to the user due to the sharper edge.

Therefore, in the display device 100 according to an example embodiment of the present disclosure, the distance RA2 between the plurality of second openings 112 disposed in the second sub-flexible area SA2 and the third sub-flexible area SA3 of the first flexible area MA1 is set larger than the distance RA1 between the plurality of second openings 112 disposed in the first sub-flexible area SA1 of the first flexible area MA1. Thus, it is possible to minimize or reduce a sense of inconsistency that the user may feel from external appearances. Also, the display device 100 according to an example embodiment of the present disclosure may provide higher resistance to external impacts. Thus, it is possible to minimize or reduce the risk of injury to the user.

As illustrated in FIG. 7A, the second flexible area MA2 may include a first sub-flexible area SA1, a second sub-flexible area SA2, and a third sub-flexible area SA3.

The first sub-flexible area SA1 of the second flexible area MA2 may extend downward from the first supporting area PA1. The second sub-flexible area SA2 of the second flexible area MA2 may be an area extending downward from the first sub-flexible area SA1. The third sub-flexible area SA3 of the second flexible area MA2 may be an area extending from the second sub-flexible area SA2 to the second supporting area PA2. In this case, when the back cover 110 is fully unwound, the second flexible area MA2 may be entirely disposed inside the housing part HP. Further, when the back cover 110 is fully wound, the second flexible area MA2 may be entirely wound around the roller 151. Details thereof are be described below with reference to FIGS. 8A through 8C.

First, the second supporting area PA2 may be fastened to the roller 151. Thus, the second supporting area PA2 may be disposed on the flat surface of the roller 151. The back cover 110 may be fastened to the roller 151 by the screws SC penetrating the second alignment holes AH2 in the second supporting area PA2.

When the back cover 110 is wound around the roller 151, the third sub-flexible area SA3 of the second flexible area MA2 may be disposed on the curved surface adjacent to the flat surface of the roller 151. In this case, the interface between the flat surface and the curved surface of the roller 151 may have the smallest radius of curvature. Thus, the back cover 110 may be damaged by increased stress generated during a winding operation. Therefore, a distance RA5 between the plurality of second openings 112 disposed in the third sub-flexible area SA3 of the second flexible area MA2 may be set small. That is, the distance RA5 between the plurality of second openings 112 disposed in the edge area EA of the back cover 110 may be set small to minimize or reduce stress generated when the back cover 110 is disposed on or wound around the roller 151 during a winding operation. Thus, it is possible to minimize or suppress damage to the back cover 110.

Further, when the back cover 110 is wound around the roller 151, the first sub-flexible area SA1 of the second flexible area MA2 may be disposed on the curved surface adjacent to the flat surface of the roller 151. In this case, the interface between the flat surface and the curved surface of the roller 151 may have the smallest radius of curvature. Thus, the back cover 110 may be damaged by increased stress generated during a winding operation. Therefore, a distance RA3 between the plurality of second openings 112 disposed in the first sub-flexible area SA1 of the second flexible area MA2 may also be set small. Thus, it is possible to minimize or reduce stress generated when the back cover 110 is disposed on or wound around the roller 151 during a winding operation. Also, it is possible to minimize or suppress damage to the back cover 110.

When the back cover 110 is wound around the roller 151, the second sub-flexible area SA2 of the second flexible area MA2 may be disposed on the curved surface of the roller 151 that is not adjacent to the flat surface of the roller. Therefore, for the second sub-flexible area SA2 of the second flexible area MA2, it may not be necessary to consider increased stress generated during a winding operation. Thus, a distance RA4 between the plurality of second openings 112 disposed in the second sub-flexible area SA2 of the second flexible area MA2 may be set smaller than the distances RA3 and RA5 between the plurality of second openings 112 disposed in the first and third sub-flexible areas SA1 and SA3, respectively, of the second flexible area MA2.

Hereafter, winding of the back cover 110 and the display panel 120 around the roller 151 is described in more detail with reference to FIGS. 8A through 8C.

<Winding of the Back Cover and the Display Panel>

Figure 8A:
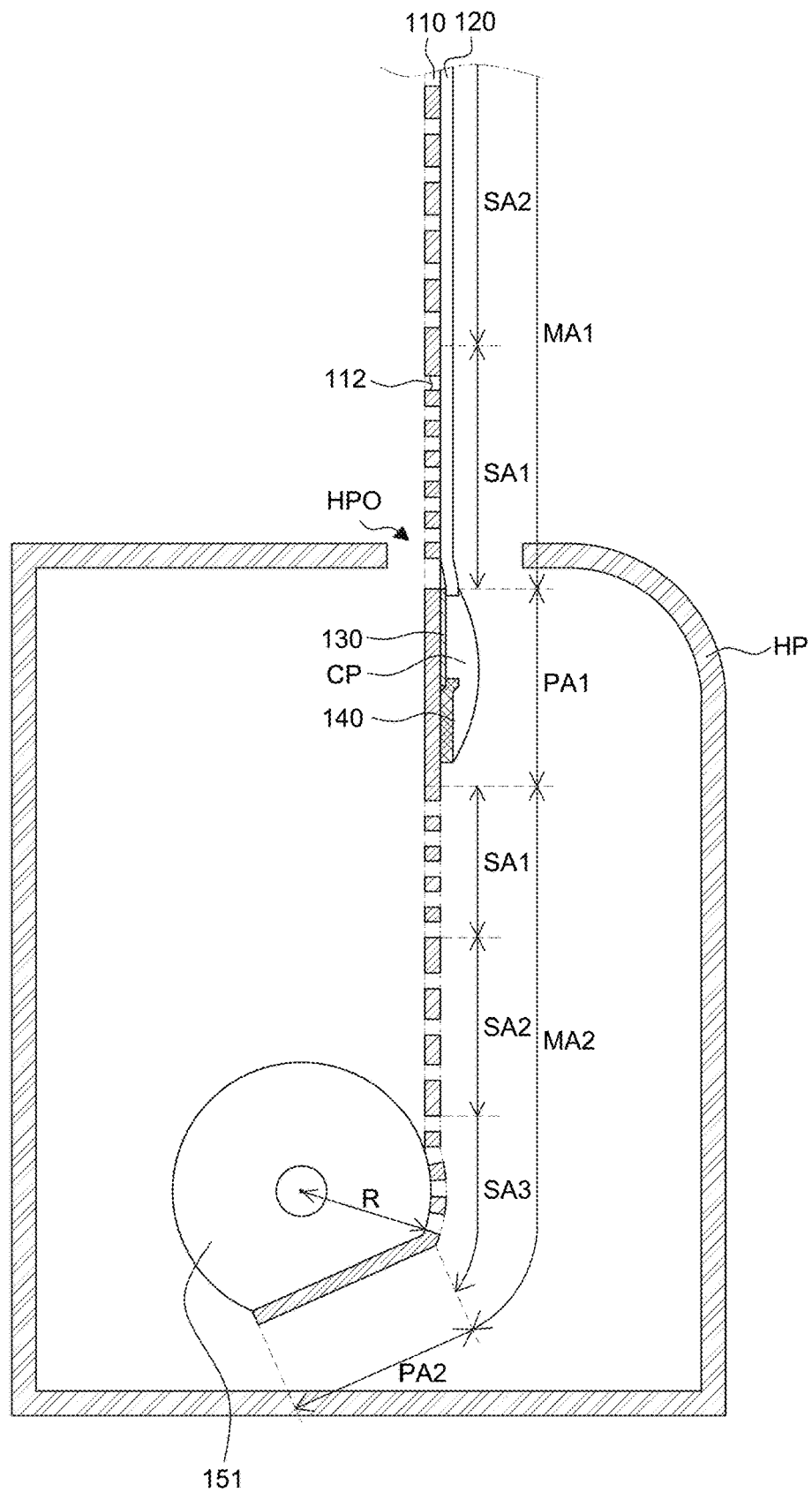
FIGS. 8A through 8C are cross-sectional views of the display device according to an example embodiment of the present disclosure.
Figure 8B:
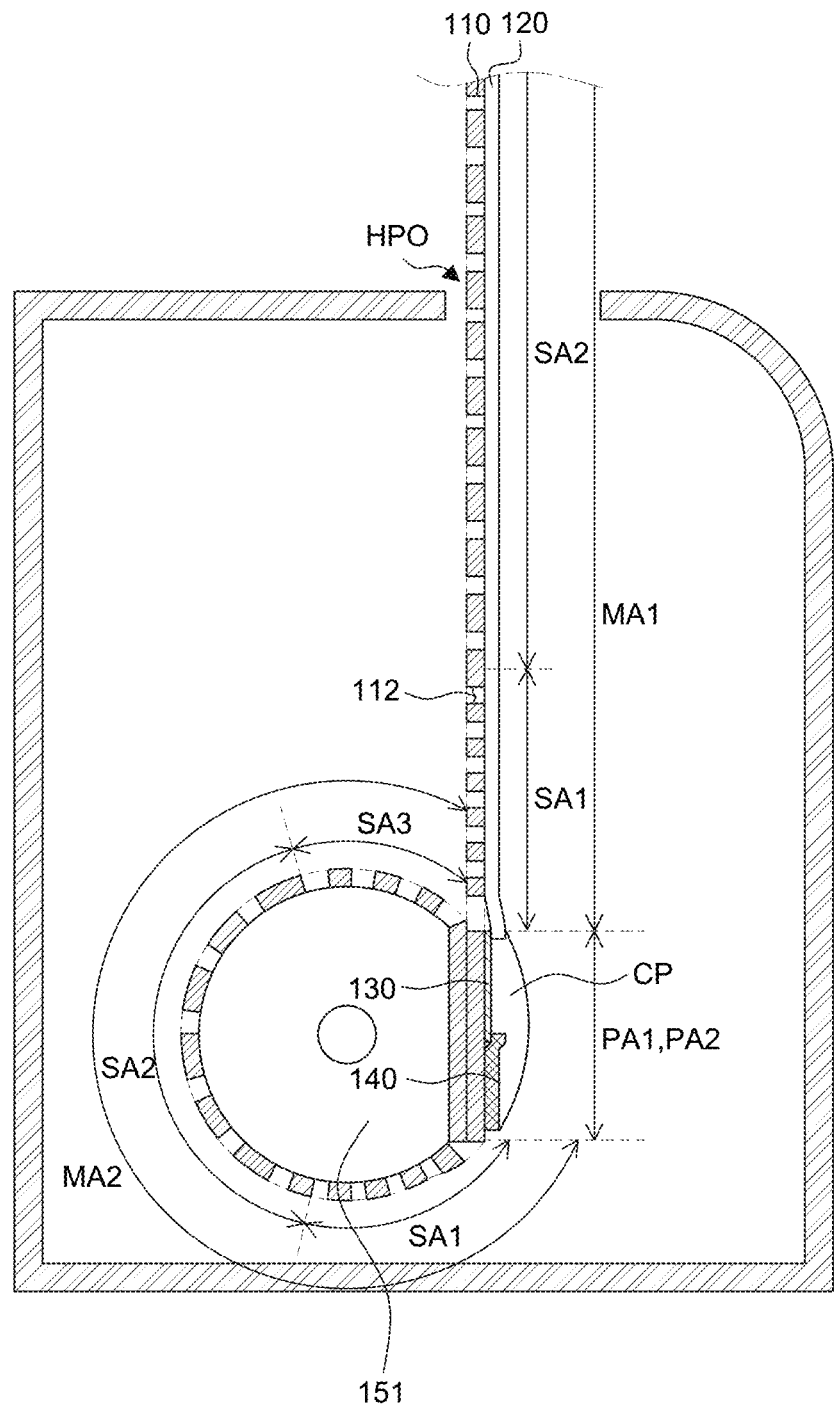
Figure 8C:
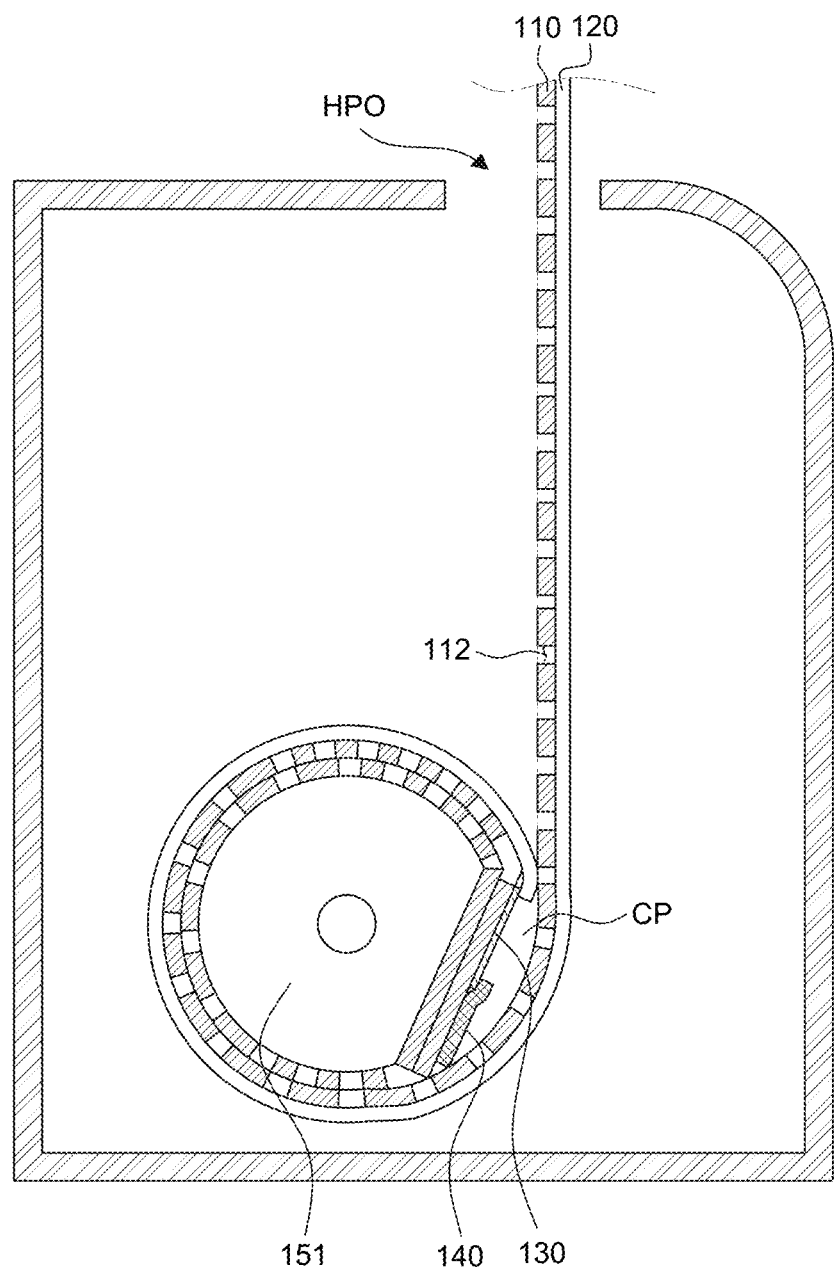

FIGS. 8A through 8C are cross-sectional views of the display device according to an example embodiment of the present disclosure.

FIG. 8A is a cross-sectional view of the back cover 110 and the display panel 120 fully unwound from the roller 151.

As illustrated in FIG. 8A, the roller 151 may have a cylindrical shape overall but may be partially flat. That is, a part of the outer peripheral surface of the roller 151 may be flat, and the other part of the outer peripheral surface may be curved or round.

The second supporting area PA2 of the back cover 110 may be fastened to the flat part of the roller 151. Except the second supporting area PA2 of the back cover 110 fastened to the roller 151, the other area of the back cover 110 extending from the second supporting area PA2 may be substantially flat.

A cover part CP may be further disposed on the flexible films 130 and the printed circuit board 140 disposed in the first supporting area PA1. The cover part CP may be disposed to cover the flexible films 130 and the printed circuit board 140, and may have a convex shape. The cover part CP may protect the printed circuit board 140 and the flexible films 130, and may be formed of an insulating material, such as resin, but is not limited thereto.

As described above with reference to FIG. 7A and FIG. 7B, when the back cover 110 is in the fully unwound state, the second flexible area MA2 and the first supporting area PA1 of the back cover 110 may remain inside the housing part HP. In this case, the first flexible area MA1 may be presented outside the housing part HP.

As shown in FIG. 8A, the interface between the flat surface and the curved surface of the roller 151 may have a smallest radius R of curvature. The third sub-flexible area SA3 of the second flexible area MA2 of the back cover 110 may be disposed near the interface. Therefore, the third sub-flexible area SA3 of the second flexible area MA2 may be damaged by increased stress generated during a winding operation. Accordingly, as described above, in the display device 100 according to an example embodiment of the present disclosure, the distance RA5 between the plurality of second openings 112 disposed in the third sub-flexible area SA3 of the second flexible area MA2 may be set smaller than the distance RA4 between the plurality of second openings 112 disposed in the second sub-flexible area SA2 of the second flexible area MA2. Therefore, it is possible to minimize or suppress damage to the back cover 110.

In this case, a column-direction width of the third sub-flexible area SA3 of the second flexible area MA2 may be equal to or larger than ¼ of the radius R of curvature of the roller 151 at the interface between the second supporting area PA2 and the second flexible area MA2. That is, the width of the third sub-flexible area SA3 of the second flexible area MA2 in the column direction (i.e., a direction perpendicular to an extension direction of the plurality of second openings 112) may be equal to or larger than ¼ of the radius R of curvature of the roller 151 at the interface between the second supporting area PA2 and the second flexible area MA2. In the event that the column-direction width of the third sub-flexible area SA3 of the second flexible area MA2 is set excessively small, even if the distance RA5 between the plurality of second openings 112 disposed in the third sub-flexible area SA3 of the second flexible area MA2 is set small, it may be impossible to suppress concentration of stress. Thus, the column-direction width of the third sub-flexible area SA3 of the second flexible area MA2 may be set equal to or larger than ¼ of the radius R of curvature of the roller 151 at the interface between the second supporting area PA2 and the second flexible area MA2. In this case, it is possible to suppress damage to the third sub-flexible area SA3 of the second flexible area MA2 by stress generated during a winding operation.

Next, FIG. 8B illustrates the second supporting area PA2, the second flexible area MA2, and the first supporting area PA1 of the back cover 110 being wound around the roller 151. Further, the first flexible area MA1 extending from the first supporting area PA1 is illustrated as being unwound from the roller 151.

As shown in FIG. 8B, the first supporting area PA1 and the second supporting area PA2 may be disposed on the flat part of the outer peripheral surface of the roller 151, and the second flexible area MA2 may be disposed on the curved part of the roller 151.

The first supporting area PA1 to which the printed circuit board 140 and the flexible films 130 are attached may be wound on the flat part of the roller 151. Thus, the first supporting area PA1 and the printed circuit board 140 and the flexible films 130 in the first supporting area PA1 can maintain a flat state without being bent. Therefore, the flexible films 130 and the printed circuit board 140 can be maintained a flat state regardless of winding or unwinding of the display part DP, thereby suppressing potential damage to the flexible films 130 and the printed circuit board 140 that may be caused by bending.

As illustrated in FIG. 8B, the interface between the flat surface and the curved surface of the roller 151 may have a smallest radius R of curvature. The first sub-flexible area SA1 of the second flexible area MA2 and the first sub-flexible area SA1 of the first flexible area MA1 of the back cover 110 may be disposed near the interface. Therefore, the first sub-flexible area SA1 of the second flexible area MA2 and the first sub-flexible area SA1 of the first flexible area MA1 may be damaged by increased stress generated during a winding operation. Accordingly, as described above, in the display device 100 according to an example embodiment of the present disclosure, the distance RA3 between the plurality of second openings 112 disposed in the first sub-flexible area SA1 of the second flexible area MA2 may be set smaller than the distance RA4 between the plurality of second openings 112 disposed in the second sub-flexible area SA2 of the second flexible area MA2. Further, the distance RA1 between the plurality of second openings 112 disposed in the first sub-flexible area SA1 of the first flexible area MA1 may be set smaller than the distance RA2 between the plurality of second openings 112 disposed in the second sub-flexible area SA2 of the first flexible area MA1. Therefore, it is possible to minimize or suppress damage to the back cover 110.

In this case, a column-direction width of the first sub-flexible area SA1 of the second flexible area MA2 may be equal to or larger than ¼ of the radius R of curvature of the roller 151 at the interface between the first supporting area PA1 and the second flexible area MA2. Also, a column-direction width of the first sub-flexible area SA1 of the first flexible area MA1 may be equal to or larger than ¼ of the radius R of curvature of the roller 151 at the interface between the first supporting area PA1 and the first flexible area MA1. That is, the width of the first sub-flexible area SA1 of the second flexible area MA2 in the column direction (i.e., the direction perpendicular to the extension direction of the plurality of second openings 112) may be equal to or larger than ¼ of the radius R of curvature of the roller 151 at the interface between the first supporting area PA1 and the second flexible area MA2. Also, the width of the first sub-flexible area SA1 of the first flexible area MA1 in the column direction (i.e., the direction perpendicular to the extension direction of the plurality of second openings 112) may be equal to or larger than ¼ of the radius R of curvature of the roller 151 at the interface between the first supporting area PA1 and the first flexible area MA1. In the event that the column-direction widths of the first sub-flexible area SA1 of the second flexible area MA2 and the first sub-flexible area SA1 of the first flexible area MA1 are excessively small, even if the distances RA1 and RA3 between the plurality of second openings 112 disposed in the first sub-flexible area SA1 of the second flexible area MA2 and the first sub-flexible area SA1 of the first flexible area MA1, respectively, are set small, it may be impossible to suppress concentration of stress. Thus, the column-direction width of the first sub-flexible area SA1 of the second flexible area MA2 may be set equal to or larger than ¼ of the radius R of curvature of the roller 151 at the interface between the first supporting area PA1 and the second flexible area MA2. Also, the column-direction width of the first sub-flexible area SA1 of the first flexible area MA1 may be set equal to or larger than ¼ of the radius R of curvature of the roller 151 at the interface between the first supporting area PA1 and the first flexible area MA1. Therefore, it is possible to suppress potential damage to the first sub-flexible area SA1 of the second flexible area MA2 and to the first sub-flexible area SA1 of the first flexible area MA1 caused by stress generated during a winding operation.

Next, as shown in FIG. 8C, the second supporting area PA2, the second flexible area MA2 and the first supporting area PA1 of the back cover 110 may be wound around the roller 151, and a part of the first flexible area MA1 may be further wound around the roller 151.

The part of the first flexible area MA1 may be wound to overlap the curved part of the roller 151. That is, the part of the first flexible area MA1 wound on the second flexible area MA2 already wound around the curved part of the roller 151 may be bent or wound along the shape of the curved part of the roller 151.

The other part of the first flexible area MA1 may be wound to overlap the flat part of the roller 151. The second supporting area PA2 wound on the flat part of the roller 151 and the other part of the first flexible area MA1 wound on the first supporting area PA1 may be bent or wound in a similar shape as the part of the first flexible area MA1 wound to overlap the curved part of the roller 151.

Specifically, the first flexible area MA1 may be wound around the roller 151 so as to cover the first supporting area PA1. In this case, the cover part CP may be disposed between the first flexible area MA1 and the first supporting area PA1. Therefore, the first flexible area MA1 may be wound to cover the cover part CP of the first supporting area PA1 and bent along the shape of the cover part CP. Since the cover part CP has a curved outer surface, the first flexible area MA1 may also be bent along the shape of the curved surface. Particularly, an upper or outer curved surface of the cover part CP may correspond in shape to the roller 151. Thus, a cross section of the first flexible area MA1 wound around the roller 151 may have a substantially circular shape.

In a display device according to another example embodiment of the present disclosure, the first supporting area PA1 can constantly maintain a flat state, thereby minimizing or suppressing damage to the flexible films 130 and the printed circuit board 140 attached to the first supporting area PA1. The first supporting area PA1 may refer to an area where the flexible films 130 and the printed circuit board 140 are attached and may constantly maintain a flat state. Since the first supporting area PA1 can constantly maintain a flat state, there may not be a need to form the plurality of first openings 111 and second openings 112 in the first supporting area PA1. Specifically, during winding of the back cover 110 around the roller 151, the back cover 110 may be bent and wound along the shape of the roller 151. In the display device according to another example embodiment of the present disclosure, the roller 151 may include the flat part on which the first supporting area PA1 is wound. Therefore, the first supporting area PA1 may be wound flat on the roller 151. The first supporting area PA1 can constantly maintain a flat state even though it is wound around the roller 151. Therefore, the flexible films 130 and the printed circuit board 140 attached to the first supporting area PA1 can also constantly maintain a flat state. For example, if the display part DP is fully unwound, the flexible films 130 and the printed circuit board 140 may be maintained flat by the first supporting area PA1 having high rigidity. On the other hand, if the display part DP is fully wound, the flexible films 130 and the printed circuit board 140 may be disposed on the flat part of the roller 151 and thus may be maintained flat. Therefore, in the display device according to another example embodiment of the present disclosure, repeated bending of the flexible films 130 and the printed circuit board 140 can be prevented or suppressed. Thus, damage to the flexible films 130 and the printed circuit board 140 can be minimized or reduced.

<Various Shapes of a Plurality of Openings in the Back Cover>

Figure 9A:
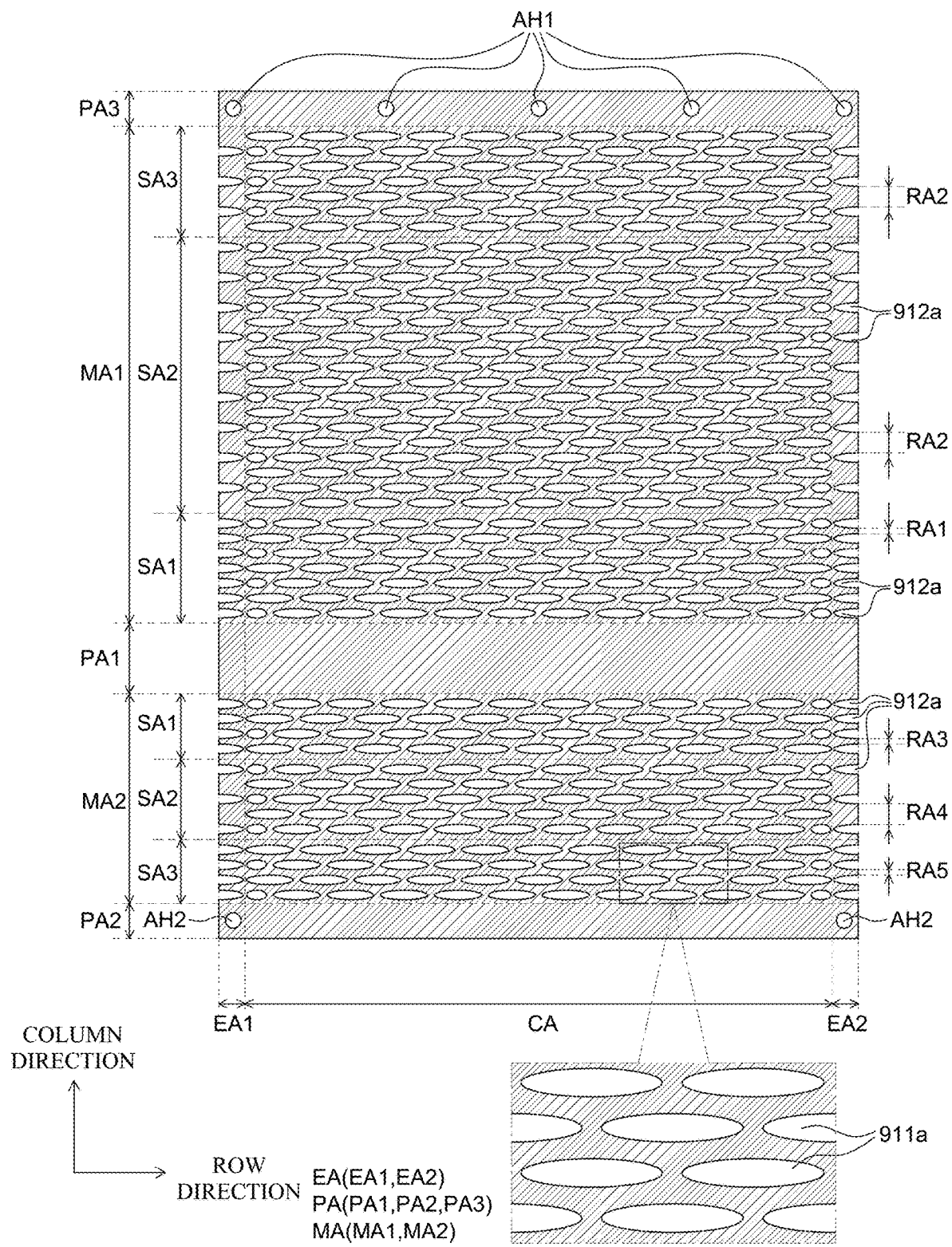
FIGS. 9A through 9C are plan views of back covers of display devices according to various example embodiments of the present disclosure.
Figure 9B:
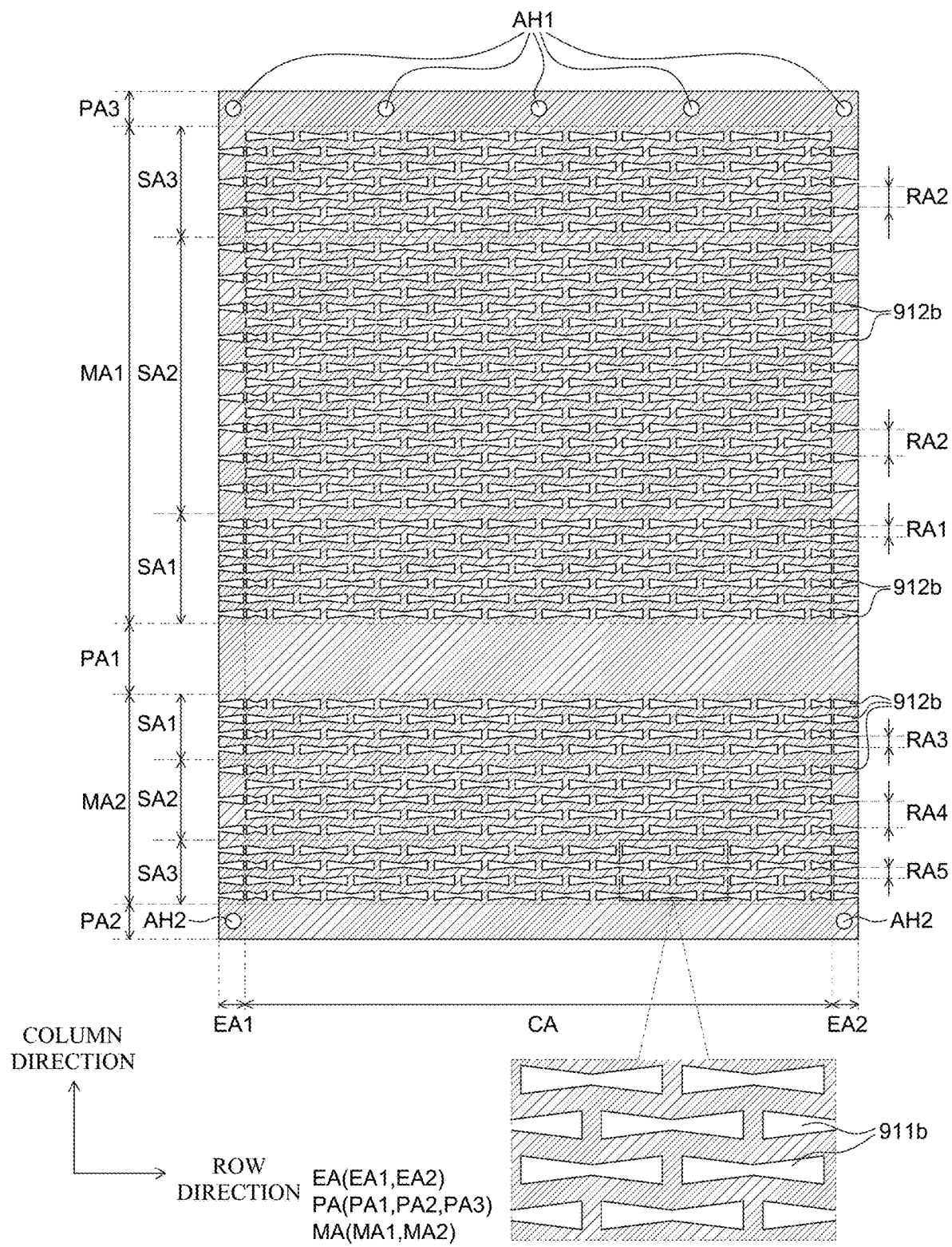
Figure 9C:
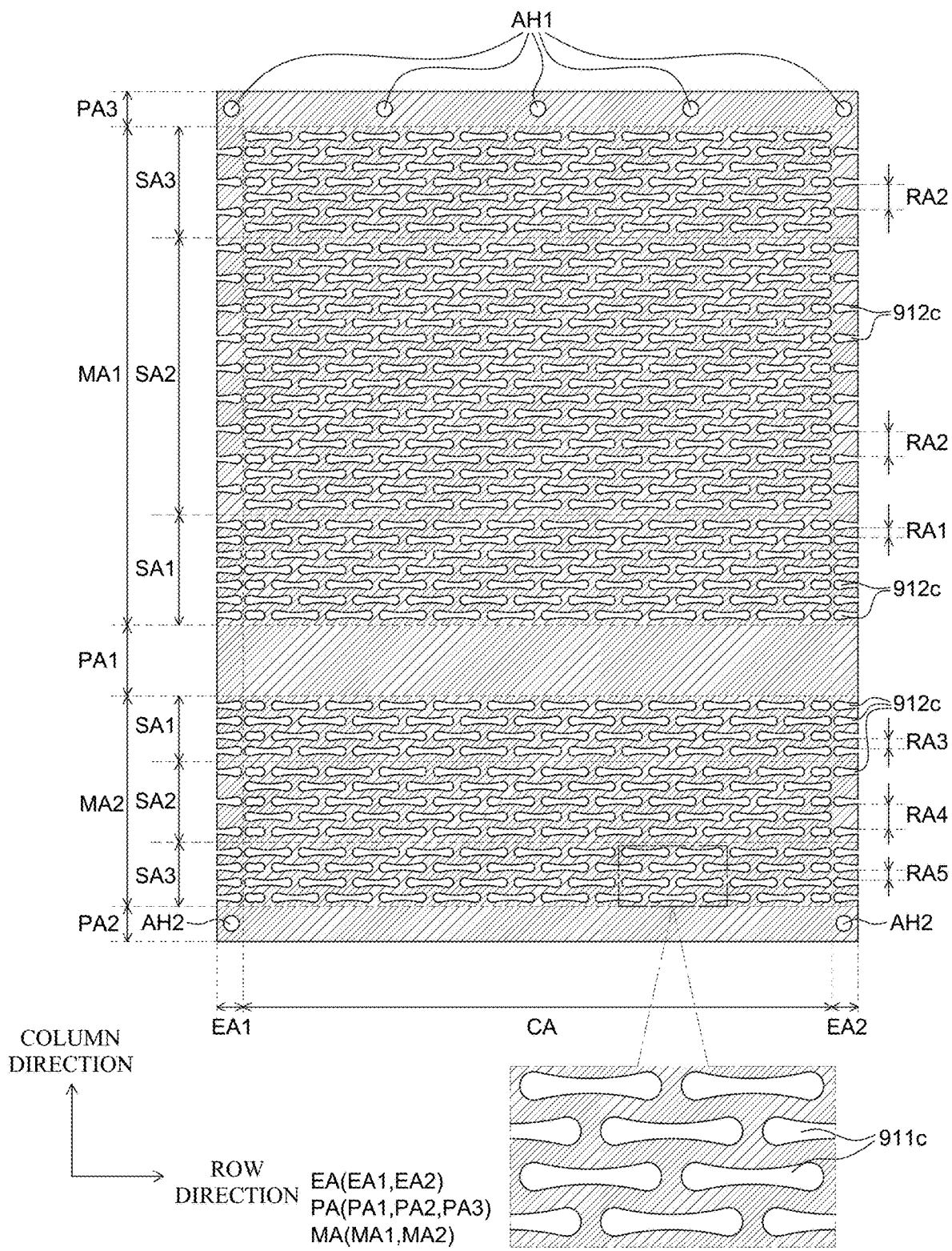

FIGS. 9A through 9C are plan views of back covers of display devices according to various example embodiments of the present disclosure. Back covers 910a, 910b, and 910c illustrated respectively in FIGS. 9A through 9C have substantially the same configuration as the back cover 110 illustrated in FIGS. 1 through 8C, with the exception of the shapes of a plurality of first openings 911a, 911b, and 911c and a plurality of second openings 912a, 912b, and 912c. Therefore, redundant description of the same or similar components is not provided.

As shown in FIG. 9A, a plurality of first openings 911a and a plurality of second openings 912a may be disposed in the central area CA of the flexible area MA of a back cover 910a and the edge area EA of the flexible area MA, respectively. Each of the plurality of first openings 911a and second openings 912a may have an oval shape. Specifically, each of the plurality of first openings 911a and second openings 912a may be formed into an oval shape with a long axis in the row direction and a short axis in the column axis.

As illustrated in FIG. 9B, a plurality of first openings 911b and a plurality of second openings 912b may be disposed in the central area CA of the flexible area MA of a back cover 910b and the edge area EA of the flexible area MA, respectively. Each of the plurality of first openings 911b and second openings 912b may have a ribbon shape. Specifically, a column-direction width of each of the plurality of first openings 911b and second openings 912b may decrease from both ends toward the center of each of the plurality of first openings 911b and second openings 912b. Therefore, each of the plurality of first openings 911b and second openings 912b may be formed into a ribbon shape.

As shown in FIG. 9C, a plurality of first openings 911c and a plurality of second openings 912c may be disposed in the central area CA of the flexible area MA of a back cover 910c and the edge area of the flexible area MA, respectively. Each of the plurality of first openings 911c and second openings 912c may have a dumbbell shape. Specifically, a column-direction width of each of the plurality of first openings 911c and second openings 912c may increases from the center of each of the plurality of first openings 911c and second openings 912c toward the lateral ends of the opening. In this case, both ends of each of the plurality of first openings 911c and second openings 912c may have a round shape. Therefore, each of the plurality of first openings 911c and second openings 912c may be formed into a dumbbell shape.

FIGS. 9A through 9C illustrate that the plurality of first openings 911a, 911b, and 911c may have an oval shape, a ribbon shape, and a dumbbell shape, respectively. However, the shape of the plurality of first openings 911a, 911b, and 911c and second openings 912a, 912b, and 912c is not limited thereto as long as their row-direction width is larger than their column-direction width. For example, the plurality of first openings 911a, 911b, and 911c and second openings 912a, 912b, and 912c may be designed to have various shapes, such as a rectangular shape, a diamond shape, etc.

Further, FIGS. 9A through 9C each illustrate that the plurality of first openings 911a, 911b, and 911c and the plurality of second openings 912a, 912b, and 912c of the back covers 910a, 910b, and 910c may have the same shape. However, the plurality of first openings 911a, 911b, and 911c and the plurality of second openings 912a, 912b, and 912c of each of the back covers 910a, 910b, and 910c may also be different in shape from one another.

In the display devices according to various example embodiments of the present disclosure, the plurality of first openings 911a, 911b, and 911c and the plurality of second openings 912a, 912b, and 912c of the back covers 910a, 910b, and 910c may be changed in various shapes and sizes to minimize or suppress stress applied to the display panel 120 and to enable the back covers 910a, 910b, and 910c to be flexibly deformed when wound or unwound. Specifically, the plurality of first openings 911a, 911b, and 911c and the plurality of second openings 912a, 912b, and 912c may be formed in the back covers 910a, 910b, and 910c, respectively. Thus, during winding or unwinding of the back covers 910a, 910b, and 910c, the back covers 910a, 910b, and 910c can be flexibly deformed. When the plurality of first openings 911a, 911b, and 911c and the plurality of second openings 912a, 912b, and 912c are flexibly deformed, stress generated during winding of the back covers 910a, 910b, and 910c can be dispersed. Also, stress applied to the display panel 120 disposed in the flexible area MA of the back covers 910a, 910b, and 910c can be minimized or suppressed. In this case, the plurality of first openings 911a, 911b, and 911c and the plurality of second openings 912a, 912b, and 912c may be formed such that the interfaces are not parallel to the row direction. Thus, stress can be dispersed. Specifically, during winding of the back covers 910a, 910b, and 910c in the column-direction of the plurality of first openings 911a, 911b, and 911c and the plurality of second openings 912a, 912b, and 912c, stress may be applied in a vertical stretch direction, i.e., the column direction, of the plurality of first openings 911a, 911b, and 911c and the plurality of second openings 912a, 912b, and 912c. Also, the stress may be concentrated on the interfaces between the plurality of first openings 911a, 911b, and 911c and the plurality of second openings 912a, 912b, and 912c which are extended in a direction parallel to the row direction. In this case, the row-direction interfaces between the plurality of first openings 911a, 911b, and 911c and the plurality of second openings 912a, 912b, and 912c may not be parallel to the row direction. That is, the interfaces between the plurality of first openings 911a, 911b, and 911c and the plurality of second openings 912a, 912b, and 912c may be extended in a direction different from the row-direction. In this case, a direction normal to the interfaces between the plurality of first openings 911a, 911b, and 911c and the plurality of second openings 912a, 912b, and 912c can be defined in various directions. Also, the stress can be dispersed in various directions.

For example, if the plurality of first openings 911a and the plurality of second openings 912a have an oval shape as in the example back cover 910a shown in FIG. 9A, the row-direction interface between the plurality of first openings 911a and the plurality of second openings 912a has a curved surface. Therefore, when stress is applied to the plurality of first openings 911a and second openings 912a having an oval shape, the stress may be dispersed in various directions along a direction normal to the curved surface, i.e., the interface, between the plurality of first openings 911a and the plurality of second openings 912a.

Next, if the plurality of first openings 911b and the plurality of second openings 912b have a ribbon shape as in the example back cover 910b shown in FIG. 9B, the row-direction interface between the plurality of first openings 911b and the plurality of second openings 912b has a slanted surface. Therefore, when stress is applied to the plurality of first openings 911b and second openings 912b having a ribbon shape, the stress may be dispersed along the slanted surface, i.e., the interface, between the plurality of first openings 911b and the plurality of second openings 912b.

Finally, if the plurality of first openings 911c and the plurality of second openings 912c have a dumbbell shape as in the example back cover 910c shown in FIG. 9C, the row-direction interface between the plurality of first openings 911c and the plurality of second openings 912c has a curved surface. Therefore, when stress is applied to the plurality of first openings 911c and second openings 912c having a dumbbell shape, the stress may be dispersed in various directions along a direction normal to the curved surface, i.e., the interface, between the plurality of first openings 911c and the plurality of second openings 912c. If both ends of each of the plurality of first openings 911c and second openings 912c are relatively narrow and angular, the stress may be concentrated on the both ends of each of the plurality of first openings 911c and second openings 912c. In this case, the both ends of each of the plurality of first openings 911c and second openings 912c having a dumbbell shape may have a curved surface. Also, the both ends of each of the plurality of first openings 911c and second openings 912c may be larger in column-direction width than a central portion thereof. Therefore, in the plurality of first openings 911c and second openings 912c having a dumbbell shape, the both ends of each opening may have a large width in the column direction and may have a curved surface. Thus, it is possible to minimize or suppress concentration of the stress on the both ends of each of the plurality of first openings 911c and second openings 912c.

Accordingly, in the display devices according to various example embodiments of the present disclosure, the plurality of first openings 911a, 911b, and 911c and the plurality of second openings 912a, 912b, and 912c of the back covers 910a, 910b, and 910c may be formed such that the row-direction interfaces between the plurality of first openings 911a, 911b, and 911c and the plurality of second openings 912a, 912b, and 912c are not parallel to the row direction. Thus, during winding of the back covers 910a, 910b, and 910c, stress applied to expand the plurality of first openings 911a, 911b, and 911c and the plurality of second openings 912a, 912b, and 912c in the column direction can be dispersed.

<Length Compensation Area of Back Cover>

Figure 10:
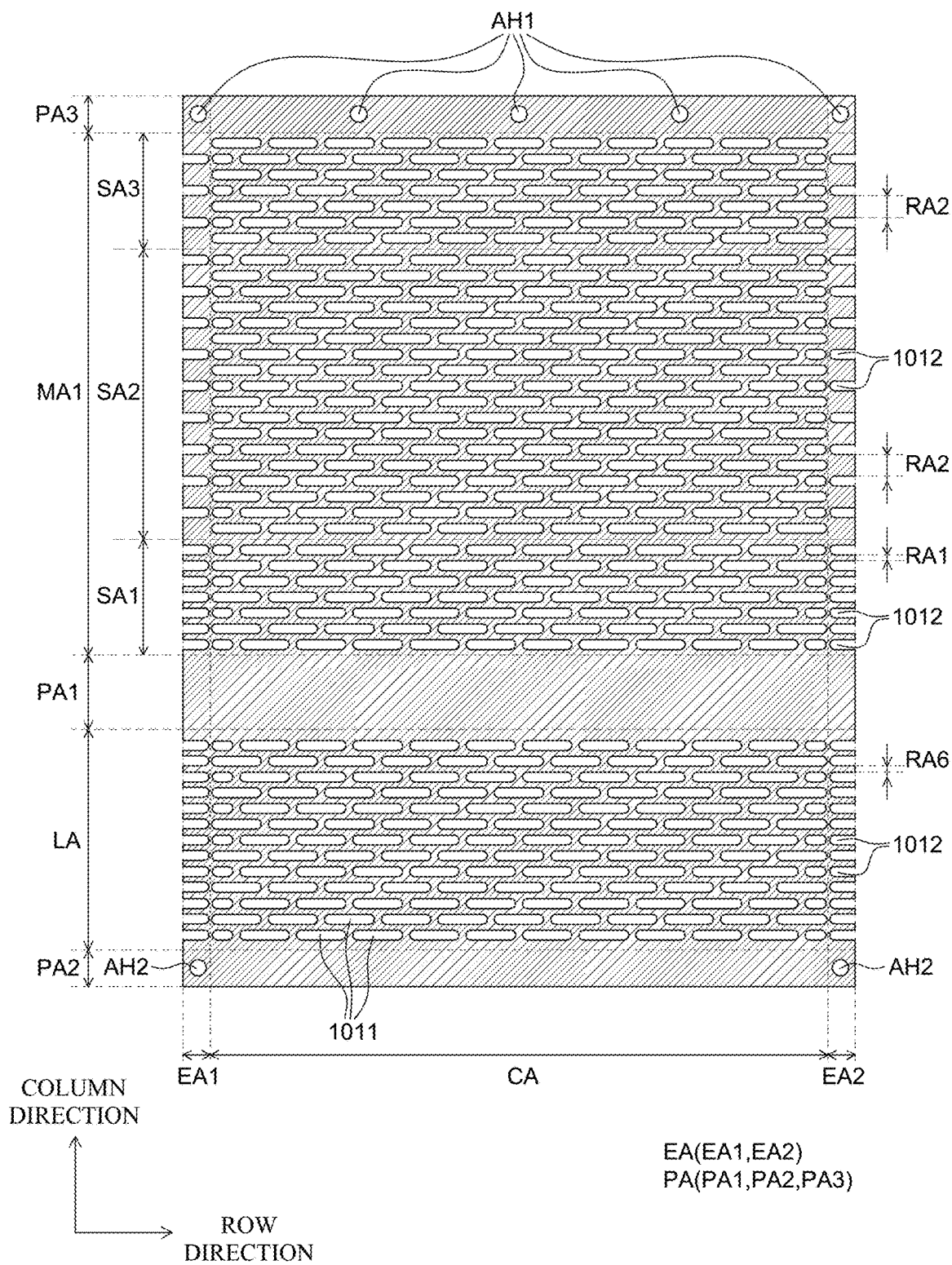
FIG. 10 is a plan view of a back cover of a display device according to yet another example embodiment of the present disclosure.

FIG. 10 is a plan view of a back cover of a display device according to yet another example embodiment of the present disclosure. A back cover 1010 illustrated in FIG. 10 has substantially the same configuration as the back cover 110 illustrated in FIGS. 1 through 8C except a length compensation area LA. Therefore, redundant description of the same components is not provided.

As shown in FIG. 10, the length compensation area LA may be disposed between the first supporting area PA1 and the second supporting area PA2 of the back cover 1010. The length compensation area LA may be disposed between the first supporting area PA1 and the second supporting area PA2 to compensate for a distance between the roller 151 and the opening HPO of the housing part HP. Specifically, as described above, when the back cover 110 and the display panel 120 are fully unwound, only the first flexible area MA1 and the third supporting area PA3 are placed outside the housing part HP. Thus, an area for connecting the first supporting area PA1 and the second supporting area PA2 may be provided, and this area may be wound around the roller 151. Therefore, the area may include a plurality of first openings 1011 and a plurality of second openings 1012.

The length compensation area LA may be placed inside the housing part HP even in the fully unwound state. Thus, the length compensation area LA may not be visible to the user. Therefore, it may not be necessary to consider a sense of inconsistency that the user may feel from external appearances. Herein, the length compensation area LA may be wound around the roller 151 prior to the first flexible area MA1 of the back cover 1010 being wound and thus may be applied with more stress than the first flexible area MA1. Therefore, in the back cover 1010 according to yet another example embodiment of the present disclosure, a distance RA6 between the plurality of second openings 1012 disposed in the length compensation area LA may be equal to or smaller than the distance RA2 between the plurality of second openings 1012 disposed in the second sub-flexible area SA2 of the first flexible area MA1. Also, the distance RA6 may be equal to or smaller than the distance RA1 between the plurality of second openings 1012 disposed in the first sub-flexible area SA1 of the first flexible area MA1. Further, the distance RA6 between the plurality of second openings 1012 disposed in the length compensation area LA may be uniform.

As for the back cover 1010 according to yet another example embodiment of the present disclosure, it may not be necessary to consider external appearances of the length compensation area LA which is not visible to the user. However, potential damage by stress generated during a winding operation may be considered. Thus, the distance RA6 between the plurality of second openings 1012 disposed in the length compensation area LA may be set equal to or smaller than the distance RA1 between the plurality of second openings 1012 disposed in the first sub-flexible area SA1 of the first flexible area MA1. Therefore, it is possible to minimize or reduce stress generated when the back cover 1010 is wound around the roller 151 during a winding operation. Also, it is possible to minimize or suppress damage to the back cover 1010.

<Improvement in Flexibility of Back Cover>

Figure 11:
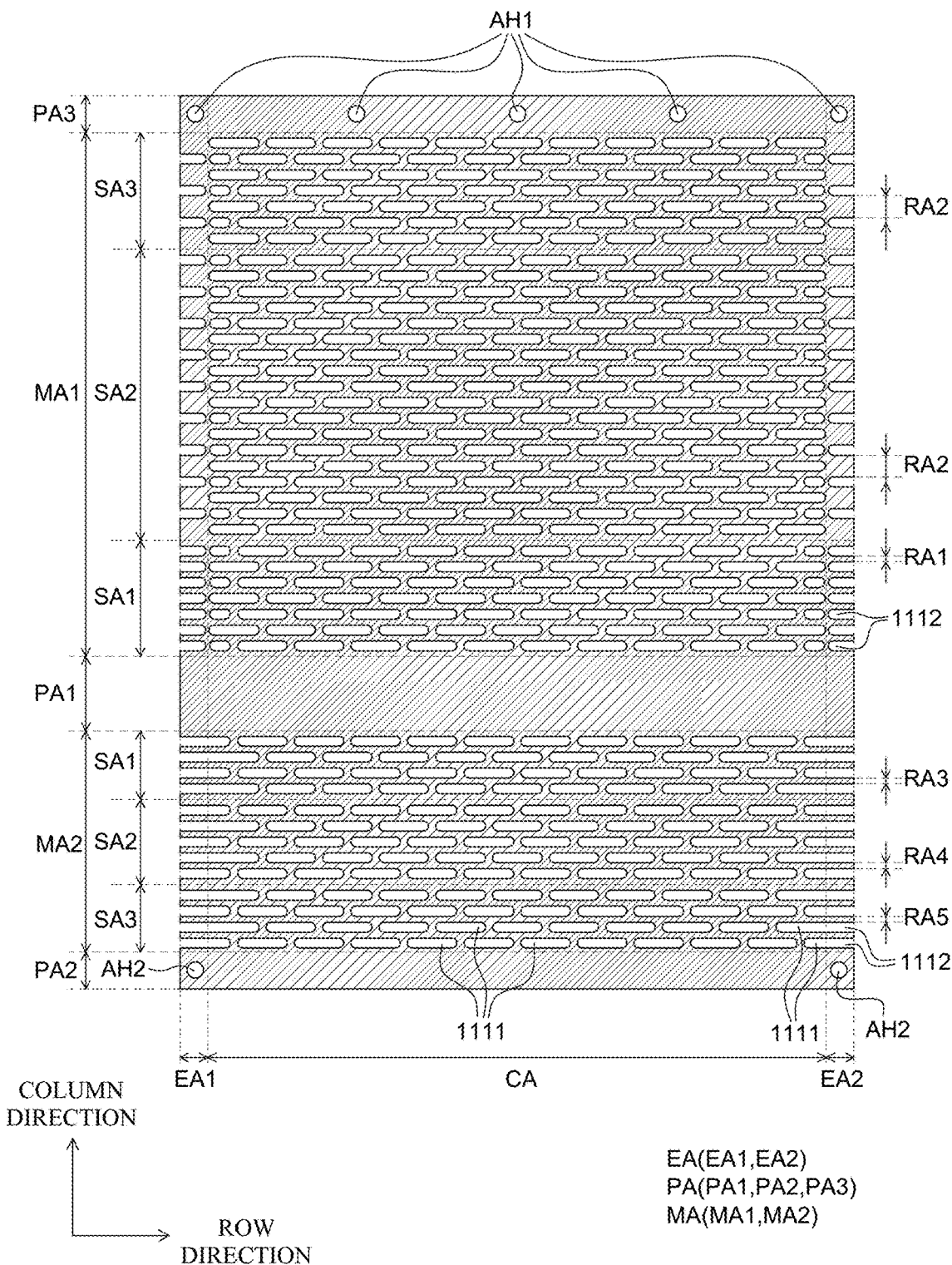
FIG. 11 is a plan view of a back cover of a display device according to still another example embodiment of the present disclosure.

FIG. 11 is a plan view of a back cover of a display device according to still another example embodiment of the present disclosure. A back cover 1110 illustrated in FIG. 11 has substantially the same configuration as the back cover 110 illustrated in FIGS. 1 through 8C, except the shape of at least some of the first openings 1111 and second openings 1112. Therefore, redundant description of the same components are not provided.

As illustrated in FIG. 11, at least some of a plurality of second openings 1112 disposed in the edge area EA of the flexible area MA may be connected respectively to a plurality of first openings 1111 disposed in the central area CA. Specifically, as shown in FIG. 11, among a plurality of second openings 1112 disposed in the first flexible area MA1 and the second flexible area MA2, a plurality of second openings 1112 disposed in the edge area EA of the second flexible area MA2 may be connected to a plurality of first openings 1111 adjacent thereto to form single openings, respectively. As shown in FIG. 11, the plurality of second openings 1112 extending from an edge of the back cover 1110 may be connected to some of first openings 1111 in the second flexible area MA2. Therefore, the plurality of second openings 1112 may extend into the central area CA of the second flexible area MA2. The combined length of the first opening 1111 and the second opening 1112 extending from the edge of the back cover 1110 and united with the first opening 1111 in the central area CA of the second flexible area MA2 may be larger than the length of the second opening 1112 extending from the edge of the back cover 1110 in the first flexible area MA1.

Therefore, in the back cover 1110 according to still another example embodiment of the present disclosure, the plurality of second openings 1112 disposed in the edge area EA of the second flexible area MA2 may be connected to the plurality of first openings 1111 adjacent thereto and form single openings, respectively. Thus, the edge area EA of the second flexible area MA2 may have a higher flexibility. Therefore, it is possible to minimize or reduce stress generated when the back cover 1110 is wound around the roller 151 during a winding operation. Also, it is possible to minimize or suppress damage to the back cover 1110.

If the plurality of second openings 1112 disposed in the edge area EA is connected to the plurality of first openings 1111 adjacent thereto, the flexibility of the edge area EA may increase. Therefore, if a side surface of the back cover 1110 is applied with an impact, the back cover 1110 may be more easily damaged. However, as described above, the second flexible area MA2 remains inside the housing part HP even in the fully unwound state. Therefore, the side surface of the back cover 1110 is unlikely to receive an external impact, e.g., by the user, during use. Accordingly, in the back cover 1110 according to still another example embodiment of the present disclosure, it may not be necessary to improve the rigidity of the side surface of the second flexible area MA2 of the back cover 1110. Also, the plurality of second openings 1112 disposed in the edge area EA of the second flexible area MA2 may be connected to the plurality of first openings 1111 adjacent thereto. Thus, it is possible to improve the rolling characteristics of the back cover 1110.

However, the present disclosure is not limited to the particular example illustrated in FIG. 11. The plurality of second openings 1112 disposed in the first sub-flexible area SA1 of the first flexible area MA1 may be connected to the plurality of first openings 1111 adjacent thereto. The first sub-flexible area SA1 of the first flexible area MA1 is adjacent to the first supporting area PA1. Thus, the first sub-flexible area SA1 of the first flexible area MA1 may be formed to have higher flexibility. Further, in the fully unwound state, the first sub-flexible area SA1 of the first flexible area MA1 may be adjacent to the opening HPO of the housing part HP. Therefore, a side surface of the first sub-flexible area SA1 of the first flexible area MA1 is not likely to be applied with an impact by the user. Thus, the plurality of second openings 1112 disposed in the first sub-flexible area SA1 of the first flexible area MA1 may be connected to the plurality of first openings 1111 adjacent thereto. This may improve the rolling characteristics in the first sub-flexible area SA1 of the first flexible area MA1.

<Protective Resin-Function of Suppressing Damage to Display Panel and Injury to User>

Figure 12A:
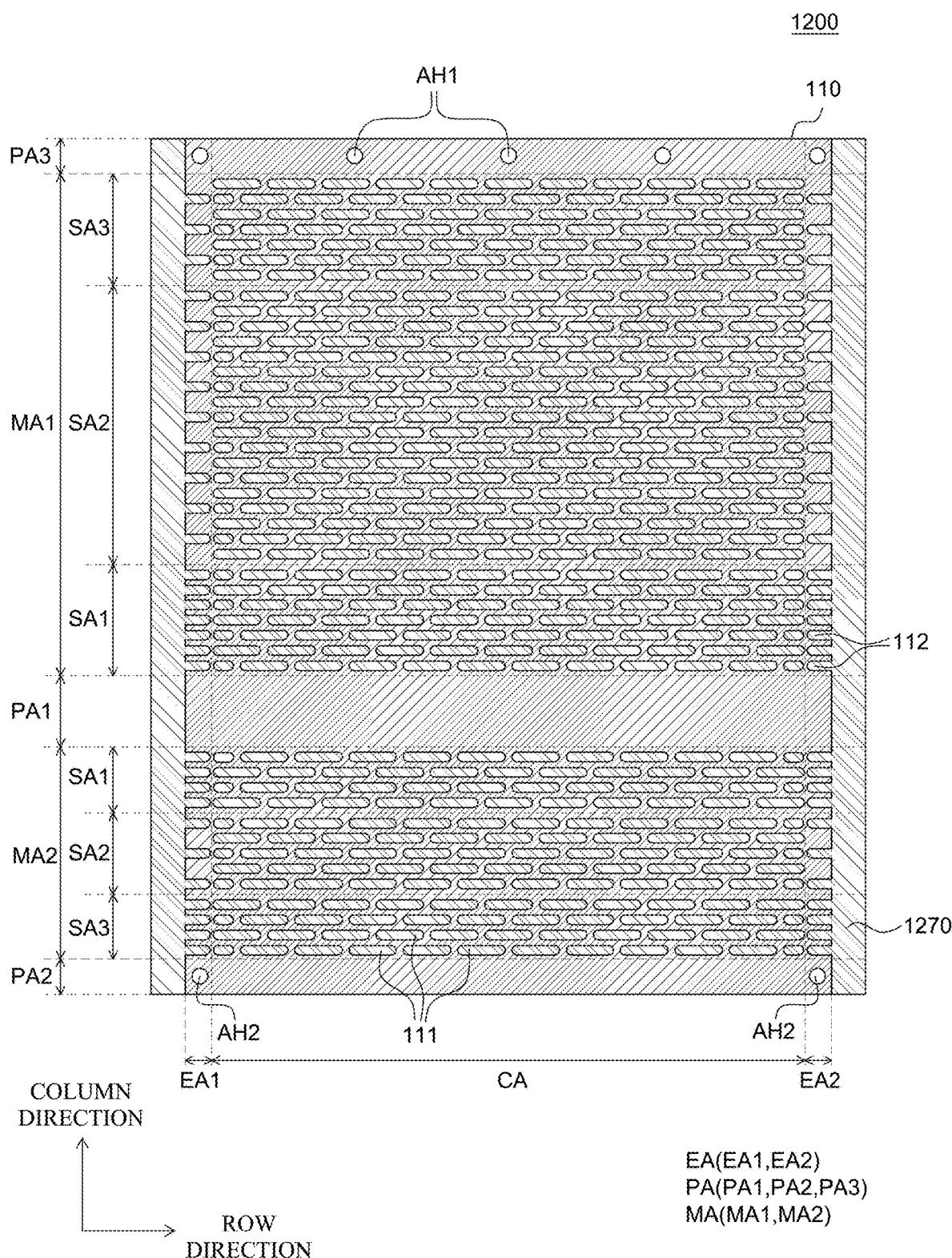
FIG. 12A is a plan view of a display device according to still another example embodiment of the present disclosure.
Figure 12B:
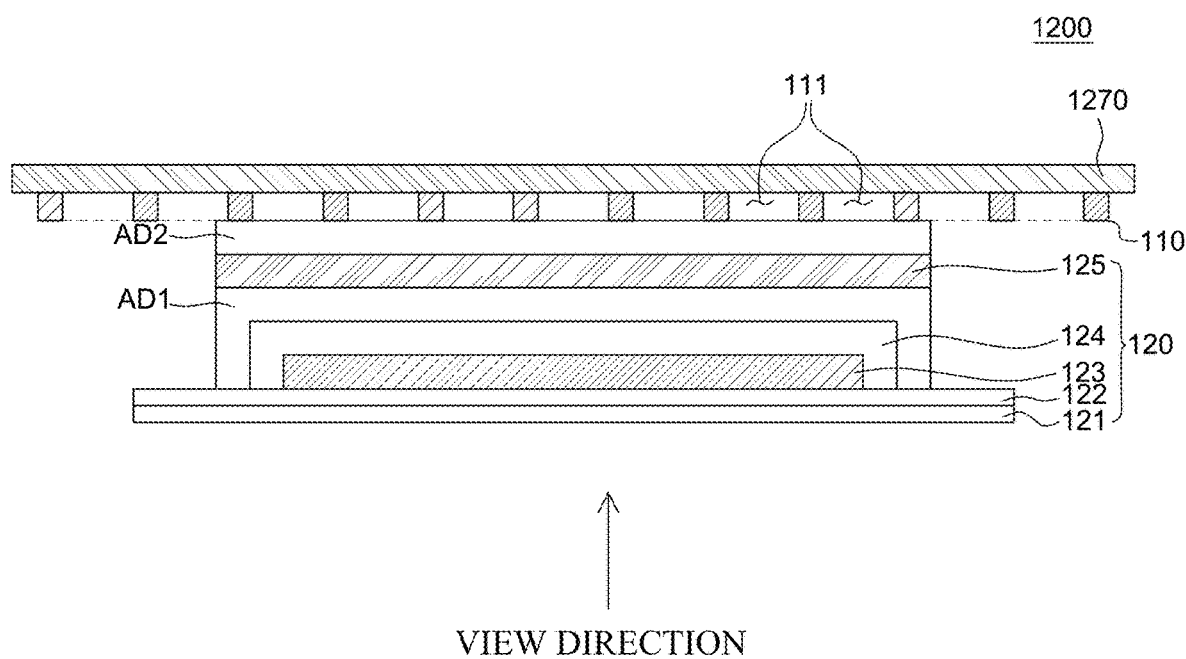
FIG. 12B is a cross-sectional view of the display device according to still another example embodiment of the present disclosure.
Figure 12C:
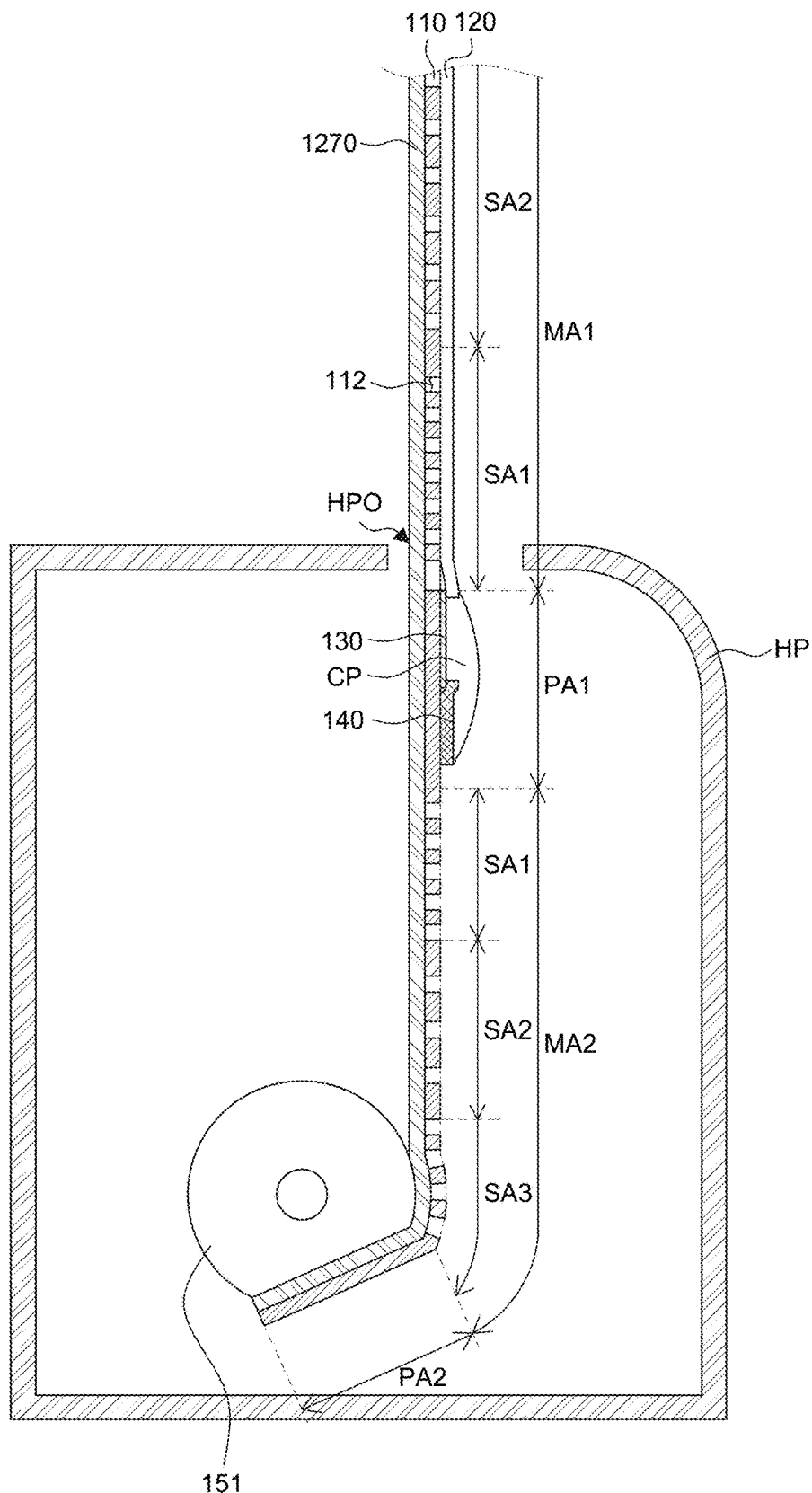
FIG. 12C is a cross-sectional view of the display device according to still another example embodiment of the present disclosure.

FIG. 12A is a plan view of a display device according to still another example embodiment of the present disclosure. FIG. 12B is a cross-sectional view of the display device according to still another example embodiment of the present disclosure. FIG. 12C is a cross-sectional view of the display device according to still another example embodiment of the present disclosure. A display device 1200 illustrated in FIGS. 12A through 12C may have substantially the same configuration as the display device 100 illustrated in FIGS. 1 through 8C, except a protective resin 1270. Therefore, redundant description of the same components are not provided. For convenience of description, FIG. 12A illustrates only the back cover 110 and the protective resin 1270 among various components of the display device 1200.

First, as shown in FIG. 12A and FIG. 12B, the protective resin 1270 serves to suppress scratches and damage to the display panel 120 that may be caused by the back cover 110. Also, the protective resin 1270 serves to suppress injury to the user that may be caused by a sharp edge of the back cover 110. The protective resin 1270 may be disposed on a surface, e.g., a rear surface, of the back cover 110, opposite to a surface of the back cover 110 to which the display panel 120 is attached. The protective resin 1270 may be formed of various resin materials and may be formed by screen printing of, e.g., silicon resin. However, the present disclosure is not limited thereto.

As illustrated in FIG. 12A, the protective resin 1270 may have the same column-direction width as the back cover 110 and may have a larger row-direction width than the back cover 110. That is, the column-direction width of the protective resin 1270 may be the same as the column-direction width of the back cover 110 ranging from the third supporting area PA3 to the second supporting area PA2. Also, the row-direction width of the protective resin 1270 may be larger than the row-direction width of the back cover 110 ranging from the left edge area EA1 to the right edge area EA2. That is, the protective resin 1270 may have a larger area than the back cover 110. Thus, the protective resin 1270 may be visible through the plurality of first openings 111 and second openings 112, and outside the edges of the back cover 110 in the row direction when viewed from the front of the display device 1200.

The back cover 110 may be formed of a metal material, a plastic material, or the like having rigidity. Thus, the left edge and the right edge of the back cover 110 may be very sharp. Further, if the back cover 110 has a large thickness, a significant amount of stress may be generated during winding and unwinding of the display panel 120 and the back cover 110. The back cover 110 itself may undergo plastic deformation. Therefore, the back cover 110 may be formed to a very small thickness of about 200 μm. Such a thin and sharp edge of the back cover 110 may be vulnerable to external impacts and thus can be easily deformed. Also, there may be a potential risk of injury to the user due to the sharp edge.

Thus, in the display device 1200 according to still another example embodiment of the present disclosure, the protective resin 1270 may be disposed on the rear surface of the back cover 110 to compensate for the sharp edge. Specifically, the protective resin 1270 may be disposed so that it extends beyond the left edge area EA1 and the right edge area EA1 of the back cover 110. Therefore, it is possible to reduce the risk of injury to the user due to the leftmost edge and the rightmost edge of the back cover 110. Also, it is possible to reduce or suppress potential deformation of the leftmost edge and the rightmost edge of the back cover 110 caused by external force.

Further, during winding of the back cover 110, the plurality of first openings 111 and second openings 112 of the back cover 110, or the edges of these openings, may come in direct contact with and cause damage to the display panel 120. Specifically, while the back cover 110 and the display panel 120 are wound by the roller 151, the display panel 120 may be wound to be in direct contact with the back cover 110. However, in this case, the back cover 110 may be formed of a metal material, a plastic material, or the like having rigidity, and the plurality of first openings 111 and second openings 112 may be disposed in the back cover 110. Therefore, a front surface of the display panel 120, particularly, the substrate 121 or the polarizing film on the substrate 121 may be scratched or damaged by the back cover 110. Accordingly, in the display device 1200 according to still another example embodiment of the present disclosure, the protective resin 1270 may be placed to cover the rear surface of the back cover 110 as shown in FIG. 12C. Thus, the back cover 110 and the display panel 120 are wound so as not to be in direct contact with each other, and the protective resin 1270 is placed between the back cover 110 and the display panel 120 during winding. Therefore, it is possible to minimize or suppress damage to the display panel 120 that may be caused by a direct contact between the back cover 110 and the display panel 120.

In addition, in the display device 1200 according to still another example embodiment of the present disclosure, the protective resin 1270 may be placed flat on the rear surface of the back cover 110. Thus, it is possible to reduce unbalanced winding that may be caused by the shape of the rear surface of the back cover 110. That is, since the back cover 110 includes the plurality of first openings 111 and the plurality of second openings 112, steps on the rear surface of the back cover 110 may cause unbalanced winding of the back cover 110 if the back cover 110 is wound without the protective resin 1270. However, in the display device 1200 according to still another example embodiment of the present disclosure, the protective resin 1270 may be placed flat on the rear surface of the back cover 110. Therefore, the protective resin 1270 can make the rear surface flat so that the protective resin 1270 and the display panel 120 can be wound in a balanced manner.

FIGS. 12A through 12C illustrate that the protective resin 1270 may be applied to the example back cover 110 illustrated in FIGS. 1 through 8C. However, the present disclosure is not limited thereto. The protective resin 1270 may be applied to any of the back covers according to various example embodiments of the present disclosure.

<Protective Resin-Function of Suppressing Decrease in Visibility Caused by Openings of Back Cover>

Figure 13A:
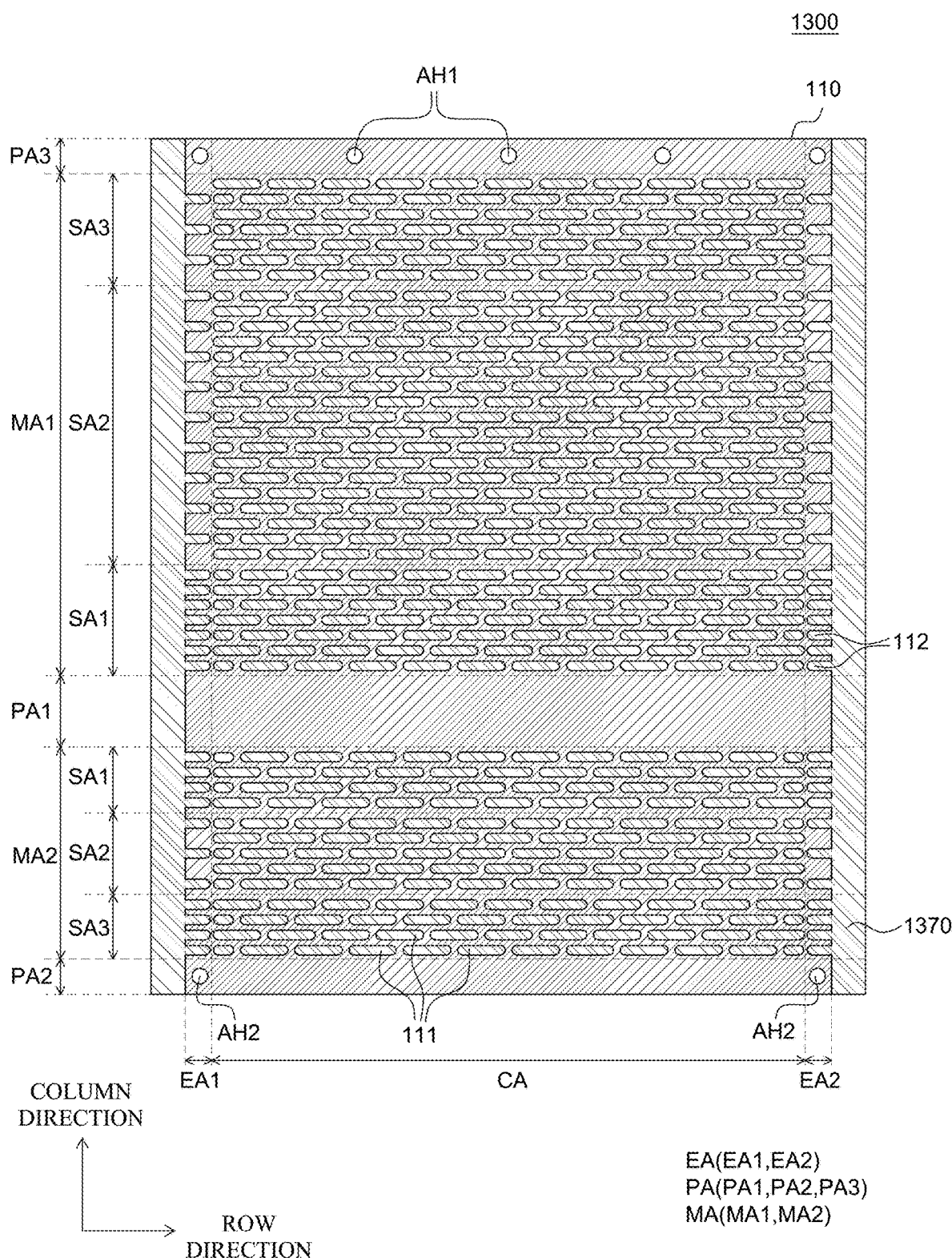
FIG. 13A is a plan view of a display device according to still another example embodiment of the present disclosure.
Figure 13B:
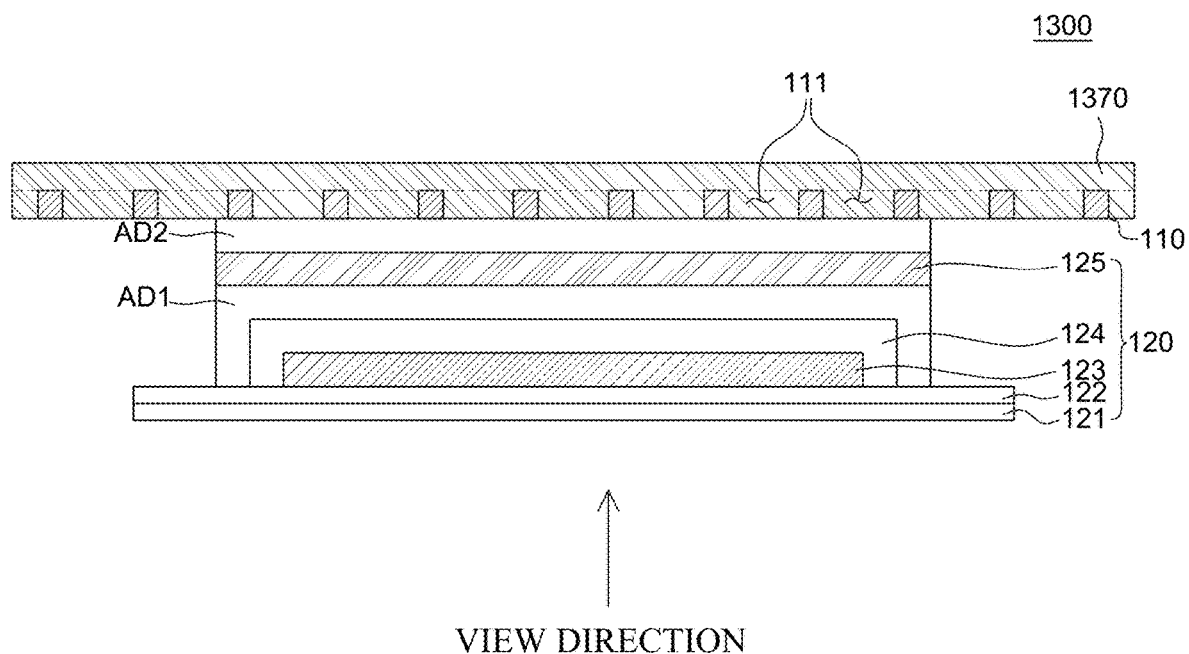
FIG. 13B is a cross-sectional view of the display device according to still another example embodiment of the present disclosure.

FIG. 13A is a plan view of a display device according to still another example embodiment of the present disclosure. FIG. 13B is a cross-sectional view of the display device according to still another example embodiment of the present disclosure. A display device 1300 illustrated in FIG. 13A and FIG. 13B may have substantially the same configuration as the display device 1200 illustrated in FIGS. 12A through 12C, except a change to a protective resin 1370. Therefore, redundant description of the same components is not provided.

As illustrated in FIG. 13A and FIG. 13B, the protective resin 1370 may be disposed on a surface, e.g., a rear surface, of the back cover 110, opposite to a surface of the back cover 110 to which the display panel 120 is attached. Also, the protective resin 1370 may fill the plurality of first openings 111 and the plurality of second openings 112 of the back cover 110. Thus, as shown in FIG. 13B, a surface to which the display panel 120 is attached may be flat as the protective resin 1370 fills the openings in the back cover 110 to form a flat surface. In this case, the protective resin 1370 may contain a black material.

The display device 1300 according to still another example embodiment of the present disclosure may be implemented as a rollable display device. Therefore, the display panel 120 may be implemented to have a very small thickness. Thus, while the user watches images on the display panel 120, the plurality of first openings 111 of the back cover 110 disposed behind the display panel 120 may be visible to the user. That is, due to the small thickness of the display panel 120, a pattern of the back cover 110 disposed behind the display panel 120 may be visible to the user. In the display device 1300 according to still another example embodiment of the present disclosure, the protective resin 1370 may fill the plurality of first openings 111 and the plurality of second openings 112 of the back cover 110 to provide a flat surface to which the display panel 120 may be attached. Therefore, when the display device 1300 is viewed from the front, the pattern formed by the plurality of first openings 111 and the plurality of second openings 112 of the back cover 110 may not be visible to the user. Particularly, if the protective resin 1370 is formed containing a black material, it is possible to reduce a sense of difference between the area where the back cover 110 is disposed and the area where the protective resin 1370 is disposed.

FIG. 13A and FIG. 13B illustrate that the protective resin 1370 may be applied to the example back cover 110 illustrated in FIGS. 1 through 8C. However, the present disclosure is not limited thereto. The protective resin 1370 may be applied to any of the back covers according to various example embodiments of the present disclosure.

<Process of Manufacturing Protective Resin>

Figure 14A:
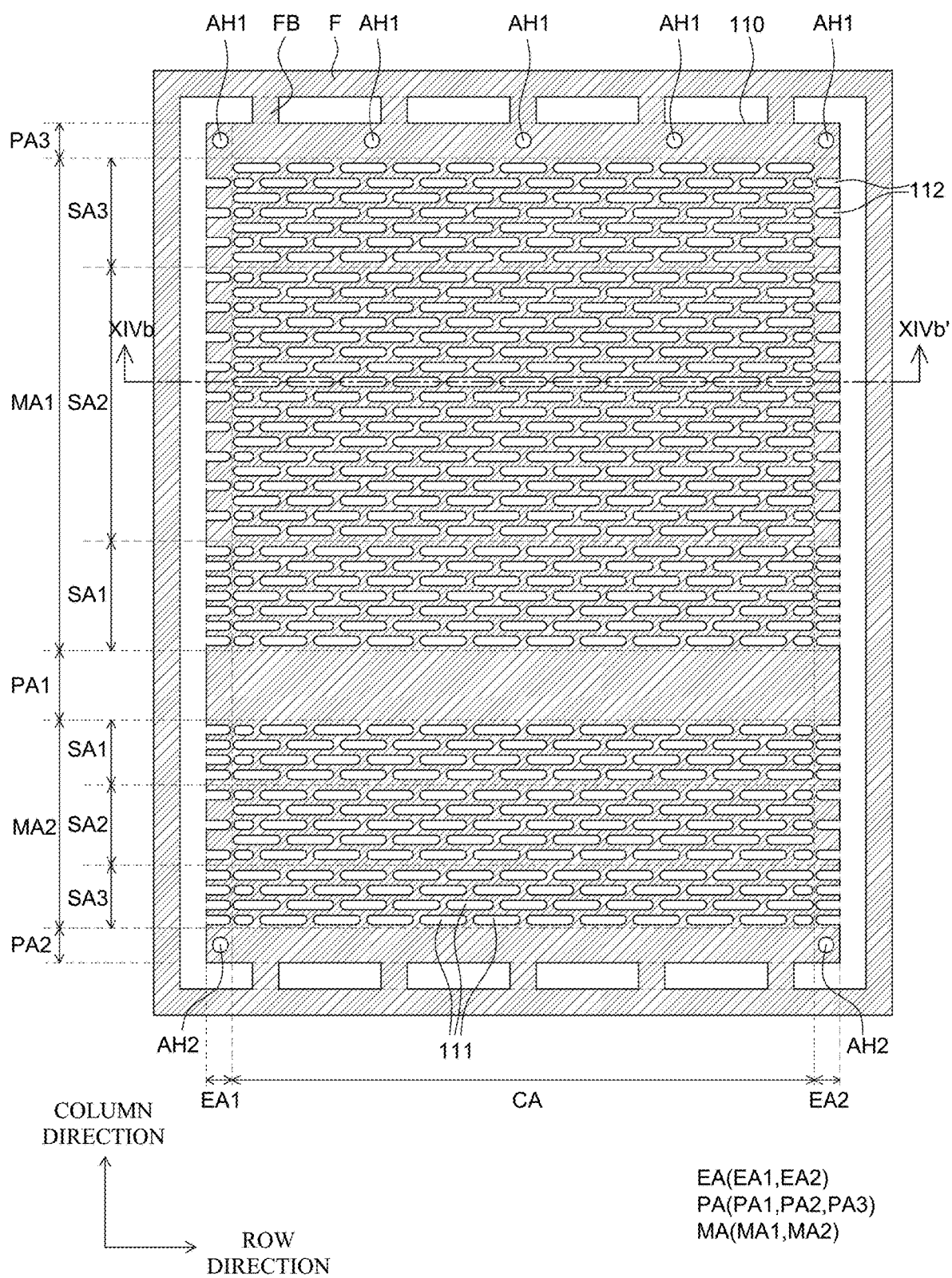
FIGS. 14A through 14F are process diagrams provided to explain a process of manufacturing the display device according to still another example embodiment of the present disclosure.
Figure 14B:
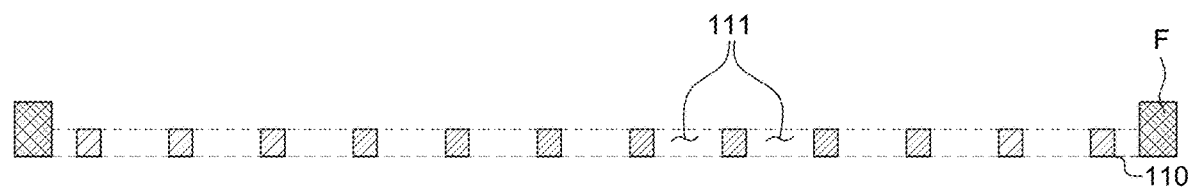
Figure 14C:
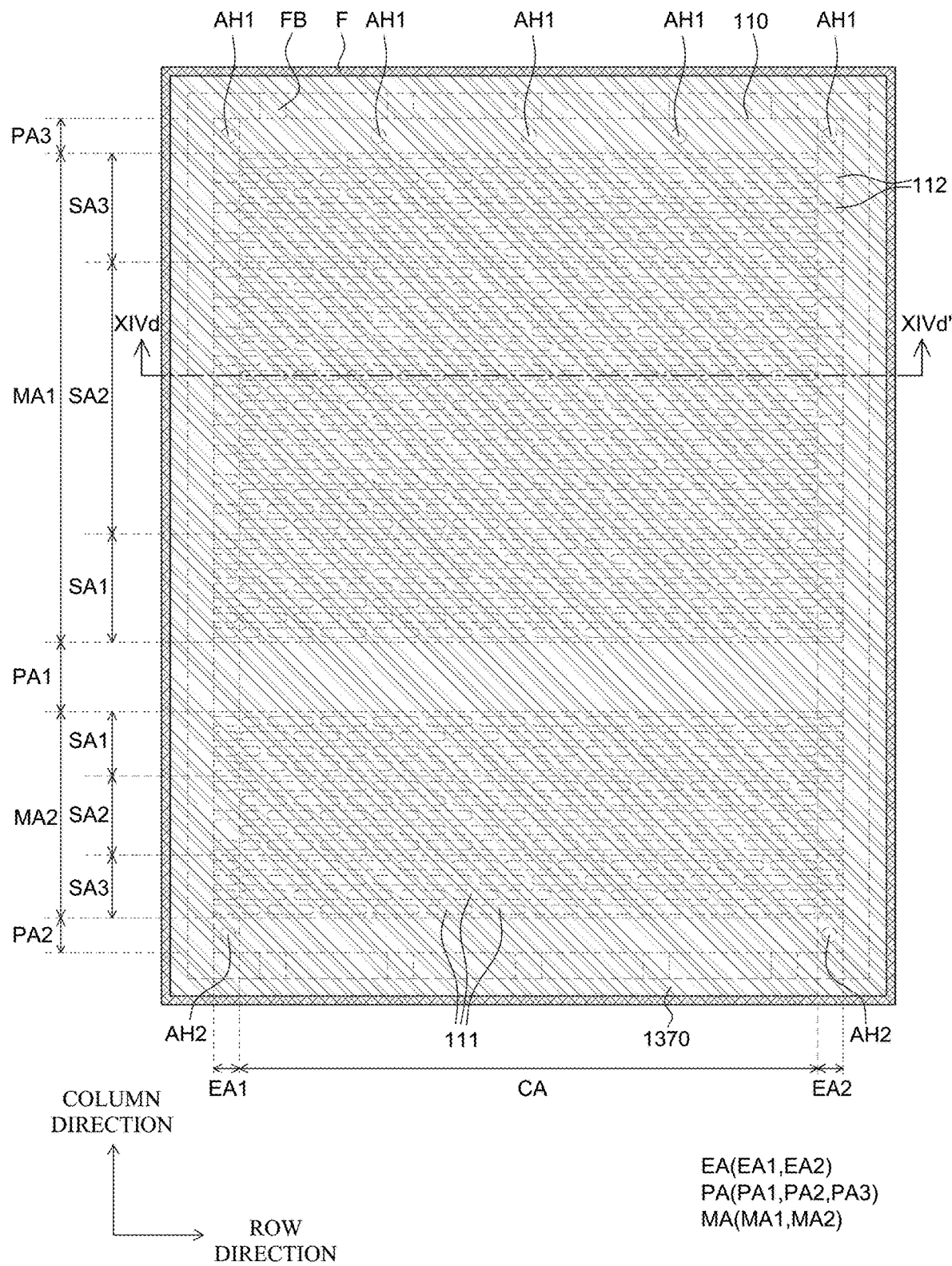
Figure 14D:
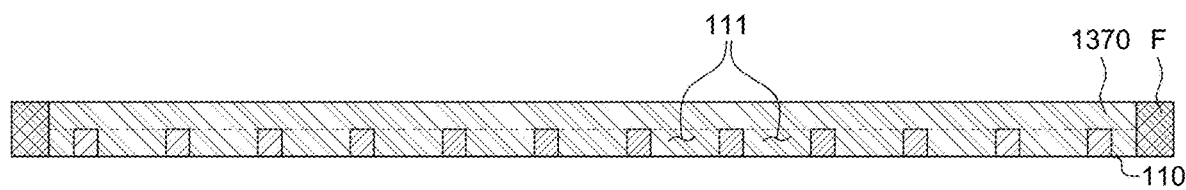
Figure 14E:
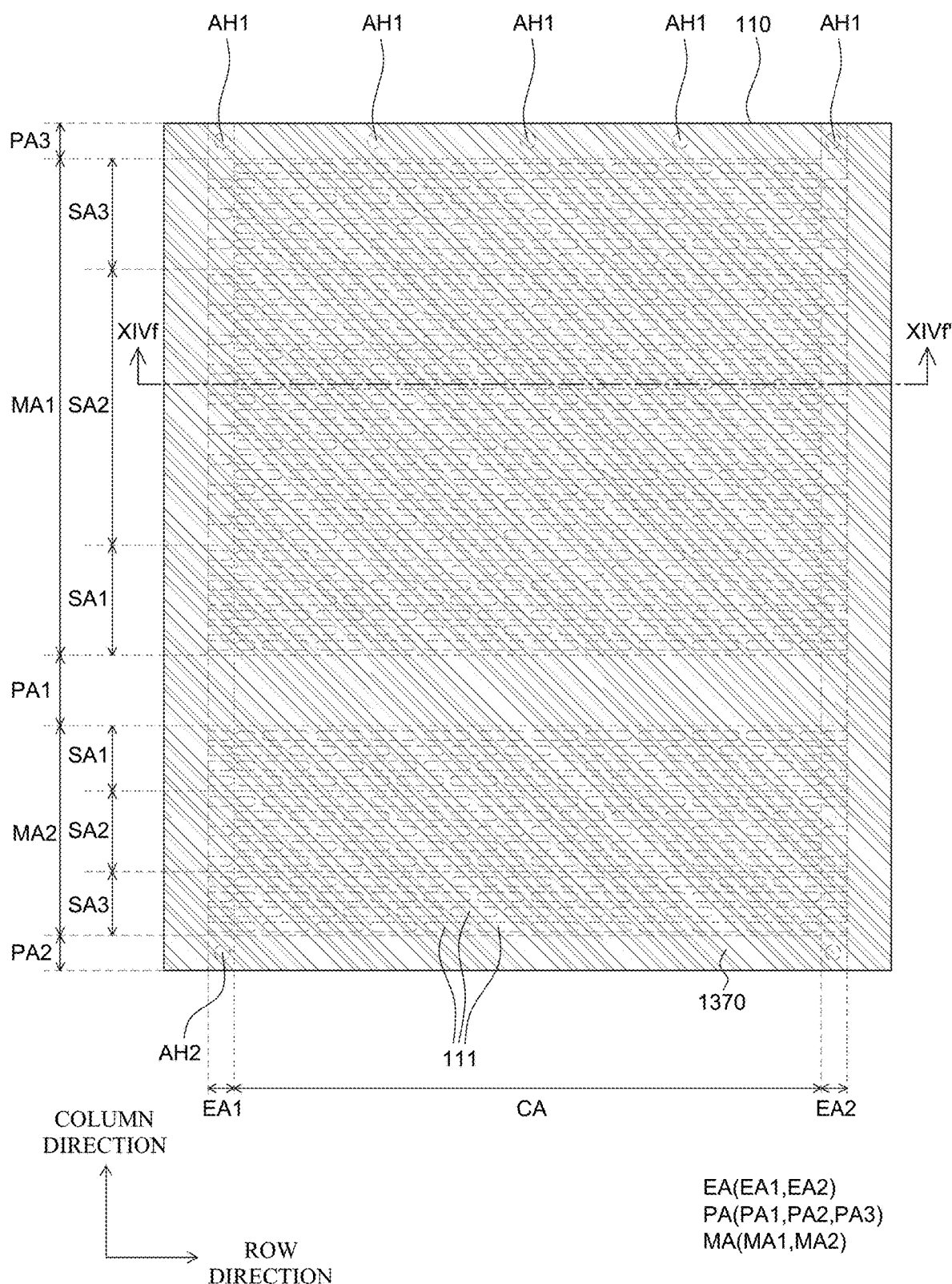
Figure 14F:
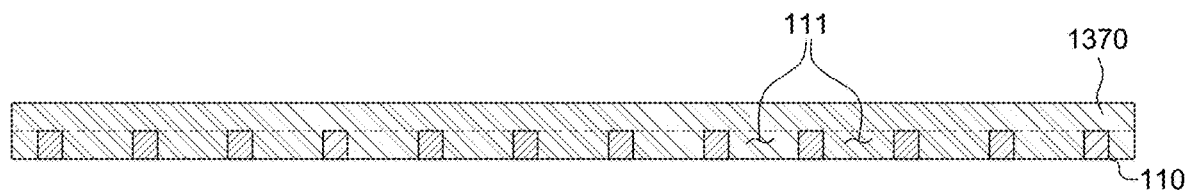

FIGS. 14A through 14F are process diagrams provided to explain a process of manufacturing the display device according to still another example embodiment of the present disclosure. Specifically, FIG. 14A is a plan view of the back cover 110 manufactured by the process of manufacturing the display device 1300 according to still another example embodiment of the present disclosure. FIG. 14B is a cross-sectional view as taken along a line XIVb-XIVb' of FIG. 14A. FIG. 14C is a plan view of the back cover 110 manufactured by the process of manufacturing the display device 1300 according to still another example embodiment of the present disclosure. FIG. 14D is a cross-sectional view as taken along a line XIVd-XIVd' of FIG. 14C. FIG. 14E is a plan view of the back cover 110 manufactured by the process of manufacturing the display device 1300 according to still another example embodiment of the present disclosure. FIG. 14F is a cross-sectional view as taken along a line XIVf-XIVf' of FIG. 14E.

First, as illustrated in FIG. 14A and FIG. 14B, the back cover 110 and a frame F may be connected by a bridge FB extending from the first supporting area PA1 and the third supporting area PA3 of the back cover 110. In this case, the frame F may have a square ring shape and may be spaced apart from the back cover 110. However, the frame F may be connected to the back cover 110 by the bridge FB extending from the first supporting area PA1 and the third supporting area PA3 of the back cover 110. In this case, the frame F, the bridge FB, and the back cover 110 may be formed of the same material and may be formed as one body. However, the frame F and the back cover 110 are not connected through the edge area EA. FIG. 14A illustrates that five bridges FB extend from each of the first supporting area PA1 and the third supporting area PA3 to connect to the frame F. However, the number of bridges FB is not limited thereto.

As shown in FIG. 14B, the frame F may have a larger thickness than the back cover 110. As will be described later, the protective resin 1370 may be formed by screen printing in a state where the frame F, the bridge FB, and the back cover 110 are formed as one body. In this process, the protective resin 1370 may flow over the frame F. To suppress this overflow, the frame F may have a larger thickness than the back cover 110.

Accordingly, as illustrated in FIG. 14C and FIG. 14D, the protective resin 1370 may be formed by coating and curing a material of the protective resin 1370 on the rear surface of the back cover 110.

In a state where the frame F, the bridge FB, and the back cover 110 are placed on a specific supporting stage, the material of the protective resin 1370 may be coated on the rear surface of the back cover 110. In this case, as shown in FIG. 14D, the frame F may have a larger thickness than the back cover 110. Thus, the material of the protective resin 1370 may not flow over the frame F. Also, the material of the protective resin 1370 may fill the plurality of first openings 111 and the plurality of second openings 112. Further, the material of the protective resin 1370 may fill an area between the back cover 110 and the edge area EA of the back cover 110. Then, the material of the protective resin 1370 may be cured to form the protective resin 1370.

Accordingly, as illustrated in FIG. 14E and FIG. 14F, after the protective resin 1370 is formed, the back cover 110 may be separated from the frame F and the bridge FB. Specifically, the back cover 110 may be separated from the frame F and the bridge FB by cutting a contact portion between the third supporting area PA3 and the bridge FB and a contact portion between the first supporting area PA1 and the bridge FB. Thus, the protective resin 1370 and the back cover 110 may have the same column-direction width, and the protective resin 1370 may have a larger row-direction width than the back cover 110. Also, a portion of the protective resin 1370 filling the first alignment holes AH1 and the second alignment holes AH2 may be removed to provide spaces through which the screws SC may be inserted into the first alignment holes AH1 and the second alignment holes AH2.

Accordingly, in the process of manufacturing the display device 1300 according to still another example embodiment of the present disclosure, the frame F and the bridge FB may be formed together with the back cover 110. Also, the protective resin 1370 may be formed easily by screen printing and cutting. Therefore, the process may be simple and may require low manufacturing costs.

Various example embodiments of the present disclosure can also be described as follows:

According to an aspect of a present disclosure, a display device may comprise: a display panel configured to display an image; and a back cover attached to a surface of the display panel. The back cover may include: a first flexible area overlapping the display panel, and a first supporting area adjacent to the first flexible area. The back cover may have a central area and an edge area at one or more lateral sides of the central area, the central area and the edge area being in at least the first flexible area of the back cover. The central area may include a plurality of first openings, and the edge area may include a plurality of second openings. The first flexible area may include a first sub-flexible area and a second sub-flexible area, the first sub-flexible area being between the first supporting area and the second sub-flexible area in a column direction, the edge area being in at least the first and second sub-flexible areas of the first flexible area. Among the second openings, a distance between two adjacent second openings in the edge area of the first sub-flexible area may be smaller than a distance between two adjacent second openings in the edge area of the second sub-flexible area.

The display device may further comprise a roller unit including a roller and configured to wind or unwind the back cover and the display panel around the roller. The roller may have a flat surface and a curved surface. The first supporting area of the back cover may be configured to be placed on the flat surface of the roller with the back cover in a wound state.

The display device may further comprise a printed circuit board placed in the first supporting area of the back cover. The display panel may be placed in the first flexible area of the back cover.

The back cover may further include: a second supporting area fixed to the roller; and a length compensation area between the first supporting area and the second supporting area, the edge area further being in the length compensation area. Among the second openings, a distance between two adjacent second openings in the edge area of the length compensation area may be smaller than the distance between the two adjacent second openings in the edge area of the second sub-flexible area of the first flexible area.

The second openings in the edge area of the length compensation area may be uniformly spaced apart from one another in a direction.

The display device may further comprise a housing configured to house the back cover and the display panel in a fully wound state. The length compensation area may be configured to be located inside the housing with the back cover and the display panel in a fully unwound state.

The display device may further comprise a head bar fixed to the back cover. The back cover may further include a third supporting area fixed to the head bar. The first flexible area may further include a third sub-flexible area between the second sub-flexible area of the first flexible area and the third supporting area, the edge area further being in the third sub-flexible area. Among the second openings, the distance between the two adjacent second openings in the edge area of the second sub-flexible area of the first flexible area may be the same as a distance between two adjacent second openings in the edge area of the third sub-flexible area of the first flexible area.

The display device may further comprise a housing configured to house the back cover and the display panel. The third sub-flexible area of the first flexible area may be configured to maintain a flat state inside the housing with the back cover and the display panel in a fully wound state.

The back cover may further include a second supporting area fixed to the flat surface of the roller and a second flexible area between the first supporting area and the second supporting area. The second flexible area may include a first sub-flexible area extending from the first supporting area in the column direction, a second sub-flexible area extending from the first sub-flexible area of the second flexible area in the column direction, and a third sub-flexible area between the second sub-flexible area of the second flexible area and the second supporting area, the edge area further being in the first, second, and third sub-flexible areas of the second flexible area. Among the second openings, a distance between two adjacent second openings in one or both of the first sub-flexible area and the third sub-flexible area of the second flexible area may be smaller than a distance between two adjacent second openings in the second sub-flexible area of the second flexible area.

The central area may further be in the second flexible area. At least some of the second openings in the edge area of the second flexible area may be connected to some of the first openings in the central area of the second flexible area and form longer openings, respectively.

A width of the first sub-flexible area of the first flexible area in the column direction may be equal to or larger than ¼ of a radius of curvature of the roller at an interface between the flat surface and the curved surface.

The display device may further comprise a protective resin placed on a surface of the back cover opposite to a surface of the back cover attached to the display panel.

The protective resin may have a same width as the back cover in a first direction, and a larger width than the back cover in a second direction substantially perpendicular to the first direction.

The protective resin may fill at least some of the first openings and the second openings.

The two adjacent second openings in both the first sub-flexible area and the second sub-flexible area may extent to a lateral edge of the back cover.

According to another aspect of the present disclosure, a display device may comprise: a display panel including a plurality of sub-pixels; a back cover supporting the display panel, and including a first supporting area and a first flexible area adjacent to the first supporting area, the first flexible area having a plurality of openings; and a roller configured to wind or unwind the display panel and the back cover, and having a flat surface and a curved surface. With the back cover in a wound state, the first supporting area may be configured to be placed on the flat surface of the roller, and the first flexible area is configured to be placed on the curved surface of the roller. Among the openings in the first flexible area, a distance between two adjacent openings at a lateral edge of the back cover may be greater farther away from the first supporting area than closer to the first supporting area.

The display device may further comprise a printed circuit board placed on the first supporting area of the back cover. The back cover may further include: a second supporting area fixed to the roller, and a second flexible area between the first supporting area and the second supporting area, the first supporting area being between the first flexible area and the second flexible area.

The second flexible area has a plurality of openings. A distance between two adjacent openings at the lateral edge of the back cover among the openings in the second flexible area is equal to or smaller than the distance between the two adjacent openings at the lateral edge of the back cover among the openings in the first flexible area.

A length of at least some of the openings at the lateral edge of the back cover in the second flexible area is larger than a length of the openings at the lateral edge of the back cover in the first flexible area.

The display device may further comprise a protective resin placed on a first surface of the back cover and having a larger area than the back cover. The display panel may be placed on a second surface of the back cover opposite the first surface.

The protective resin may further be placed inside the openings, the protective resin and the back cover together providing a substantially flat surface along the second surface of the back cover.

The protective resin may include a black material.

Although the exemplary embodiments of the present disclosure are described above in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only and are not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following appended claims, and all the technical concepts in the equivalent scope thereof should be construed as falling within the scope of the present disclosure.

It will be apparent to those skilled in the art that various modifications and variations can be made in the display device of the present disclosure without departing from the spirit or scope of the disclosure. Thus, it is intended that the present disclosure cover the modifications and variations of this disclosure provided they come within the scope of the appended claims and their equivalents.

What is claimed is:

1. A display device, comprising:
a display panel configured to display an image; and
a back cover attached to a surface of the display panel, and including:
   a first flexible area overlapping the display panel, and
   a first supporting area adjacent to the first flexible area,
wherein:
   the back cover has a central area and an edge area at one or more lateral sides of the central area,
   the central area and the edge area being in at least the first flexible area of the back cover, the central area includes a plurality of first openings, and the edge area includes a plurality of second openings,
   the first flexible area includes a first sub-flexible area and a second sub-flexible area, the first sub-flexible area being between the first supporting area and the second sub-flexible area in a column direction, the edge area being in at least the first and second sub-flexible areas of the first flexible area, and
   among the second openings, a distance between two adjacent second openings in the edge area of the first sub-flexible area is smaller than a distance between two adjacent second openings in the edge area of the second sub-flexible area;
a roller unit including a roller, and configured to wind or unwind the back cover and the display panel around the roller,
wherein the roller has a flat surface and a curved surface, and the first supporting area of the back cover is configured to be placed on the flat surface of the roller with the back cover in a wound state.

2. The display device according to claim 1, further comprising: a printed circuit board placed in the first supporting area of the back cover, wherein the display panel is placed in the first flexible area of the back cover.

3. The display device according to claim 2, wherein the back cover further includes:
a second supporting area fixed to the roller; and
a length compensation area between the first supporting area and the second supporting area, the edge area further being in the length compensation area, and
wherein, among the second openings, a distance between two adjacent second openings in the edge area of the length compensation area is smaller than the distance between the two adjacent second openings in the edge area of the second sub-flexible area of the first flexible area.

4. The display device according to claim 3, wherein the second openings in the edge area of the length compensation area are uniformly spaced apart from one another in a direction.

5. The display device according to claim 3, further comprising:
a housing configured to house the back cover and the display panel in a fully wound state,
wherein the length compensation area is configured to be located inside the housing with the back cover and the display panel in a fully unwound state.

6. The display device according to claim 2, further comprising:
a head bar fixed to the back cover,
wherein:
   the back cover further includes a third supporting area fixed to the head bar,
   the first flexible area further includes a third sub-flexible area between the second sub-flexible area of the first flexible area and the third supporting area, the edge area further being in the third sub-flexible area, and
   among the second openings, the distance between the two adjacent second openings in the edge area of the second sub-flexible area of the first flexible area is the same as a distance between two adjacent second openings in the edge area of the third sub-flexible area of the first flexible area.

7. The display device according to claim 6, further comprising:
a housing configured to house the back cover and the display panel,
wherein the third sub-flexible area of the first flexible area is configured to maintain a flat state inside the housing with the back cover and the display panel in a fully wound state.

8. The display device according to claim 1, wherein: the back cover further includes a second supporting area fixed to the flat surface of the roller and a second flexible area between the first supporting area and the second supporting area,
the second flexible area includes a first sub-flexible area extending from the first supporting area in the column direction, a second sub-flexible area extending from the first sub-flexible area of the second flexible area in the column direction, and a third sub-flexible area between the second sub-flexible area of the second flexible area and the second supporting area, the edge area further being in the first, second, and third sub-flexible areas of the second flexible area, and
among the second openings, a distance between two adjacent second openings in one or both of the first sub-flexible area and the third sub-flexible area of the second flexible area is smaller than a distance between two adjacent second openings in the second sub-flexible area of the second flexible area.

9. The display device according to claim 8, wherein:
the central area is further in the second flexible area, and
at least some of the second openings in the edge area of the second flexible area are connected to some of the first openings in the central area of the second flexible area and form longer openings, respectively.

10. The display device according to claim 1, wherein a width of the first sub-flexible area of the first flexible area in the column direction is equal to or larger than ¼ of a radius of curvature of the roller at an interface between the flat surface and the curved surface.

11. The display device according to claim 1, further comprising:
a protective resin placed on a surface of the back cover opposite to a surface of the back cover attached to the display panel.

12. The display device according to claim 11, wherein:
the protective resin has a same width as the back cover in a first direction, and
the protective resin has a larger width than the back cover in a second direction substantially perpendicular to the first direction.

13. The display device according to claim 11, wherein the protective resin fills at least some of the first openings and the second openings.

14. The display device according to claim 1, wherein the two adjacent second openings in both the first sub-flexible area and the second sub-flexible area extent to a lateral edge of the back cover.

15. A display device, comprising:
a display panel including a plurality of sub-pixels;
a back cover supporting the display panel, and including a first supporting area and a first flexible area adjacent to the first supporting area, the first flexible area having a plurality of openings; and
a roller configured to wind or unwind the display panel and the back cover, and having a flat surface and a curved surface,
wherein:
with the back cover in a wound state, the first supporting area is configured to be placed on the flat surface of the roller, and the first flexible area is configured to be placed on the curved surface of the roller, and
among the openings in the first flexible area, a distance between two adjacent openings at a lateral edge of the back cover is greater farther away from the first supporting area than closer to the first supporting area.

16. The display device according to claim 15, further comprising:
a printed circuit board placed on the first supporting area of the back cover,
wherein the back cover further includes:
a second supporting area fixed to the roller, and
a second flexible area between the first supporting area and the second supporting area, the first supporting area being between the first flexible area and the second flexible area.

17. The display device according to claim 16, wherein:
the second flexible area has a plurality of openings, and
a distance between two adjacent openings at the lateral edge of the back cover among the openings in the second flexible area is equal to or smaller than the distance between the two adjacent openings at the lateral edge of the back cover among the openings in the first flexible area.

18. The display device according to claim 16, wherein a length of at least some of the openings at the lateral edge of the back cover in the second flexible area is larger than a length of the openings at the lateral edge of the back cover in the first flexible area.

19. The display device according to claim 15, further comprising:
a protective resin placed on a first surface of the back cover and having a larger area than the back cover,
wherein the display panel is placed on a second surface of the back cover opposite the first surface.

20. The display device according to claim 19, wherein the protective resin is further placed inside the openings, the protective resin and the back cover together providing a substantially flat surface along the second surface of the back cover.

21. The display device according to claim 19, wherein the protective resin includes a black material.

* * * * *